United States Patent
Muta et al.

(10) Patent No.: US 9,461,260 B2
(45) Date of Patent: Oct. 4, 2016

(54) ORGANIC LIGHT EMITTING DEVICE

(71) Applicant: CANON KABUSHIKI KAISHA, Tokyo (JP)

(72) Inventors: Hajime Muta, Zama (JP); Yohei Iwasaki, Tokyo (JP); Tetsuo Takahashi, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 390 days.

(21) Appl. No.: 13/852,619

(22) Filed: Mar. 28, 2013

(65) Prior Publication Data

US 2013/0264550 A1 Oct. 10, 2013

(30) Foreign Application Priority Data

Apr. 5, 2012 (JP) ................ 2012-086189

(51) Int. Cl.
*H01L 51/50* (2006.01)
*H01L 51/00* (2006.01)

(52) U.S. Cl.
CPC ....... *H01L 51/5028* (2013.01); *H01L 51/0056* (2013.01); *H01L 51/5004* (2013.01); *H01L 51/5012* (2013.01); *H01L 51/5056* (2013.01); *H01L 51/006* (2013.01); *H01L 51/0058* (2013.01); *H01L 51/0072* (2013.01); *H01L 2251/308* (2013.01)

(58) Field of Classification Search
CPC ............ H01L 2251/308; H01L 51/0056; H01L 51/0058; H01L 51/006; H01L 51/0072; H01L 51/5004; H01L 51/5012; H01L 51/5028; H01L 51/5056; C09K 11/06; H05B 33/14
See application file for complete search history.

(56) References Cited

U.S. PATENT DOCUMENTS

| | | | |
|---|---|---|---|
| 6,057,048 A * | 5/2000 | Hu ................ | C07D 251/24 313/504 |
| 7,723,915 B2 | 5/2010 | Iwasaki et al. | |
| 7,914,909 B2 | 3/2011 | Watanabe et al. | |
| 8,039,128 B2 | 10/2011 | Watanabe et al. | |
| 8,354,788 B2 | 1/2013 | Okinaka et al. | |
| 2001/0021478 A1* | 9/2001 | Shi ................ | H01L 51/005 430/57.1 |
| 2004/0131880 A1* | 7/2004 | Zheng ............ | C08G 61/02 428/690 |
| 2006/0044229 A1* | 3/2006 | Yamazaki ....... | G09G 3/2022 345/76 |
| 2012/0187826 A1 | 7/2012 | Kawamura et al. | |
| 2012/0205639 A1 | 8/2012 | Nakasu et al. | |
| 2012/0313083 A1 | 12/2012 | Iwawaki et al. | |
| 2013/0001542 A1* | 1/2013 | Okajima .......... | C09K 11/06 257/40 |

FOREIGN PATENT DOCUMENTS

| | | | |
|---|---|---|---|
| GB | 2484680 A | * | 4/2012 |
| JP | 2003077676 A | | 3/2003 |
| JP | 2011-91449 A | | 5/2011 |
| JP | 2011-216640 A | | 10/2011 |
| JP | 2012-44011 A | | 3/2012 |
| JP | 2012-59789 A | | 3/2012 |
| WO | 2011/077691 A1 | | 6/2011 |

* cited by examiner

*Primary Examiner* — Dawn Garrett
(74) *Attorney, Agent, or Firm* — Fitzpatrick, Cella, Harper & Scinto

(57) ABSTRACT

Provided is an organic light emitting device that has high efficiency and high durability against continuous driving. The organic light emitting device includes an anode, a cathode, and organic compound layers placed between the anode and the cathode, in which the organic compound layers include a hole transport layer and an emitting layer, the hole transport layer and the emitting layer are in contact with each other, the hole transport layer has an arylamine compound and an aromatic hydrocarbon compound, and the emitting layer has a host and an electron trap dopant.

8 Claims, 1 Drawing Sheet

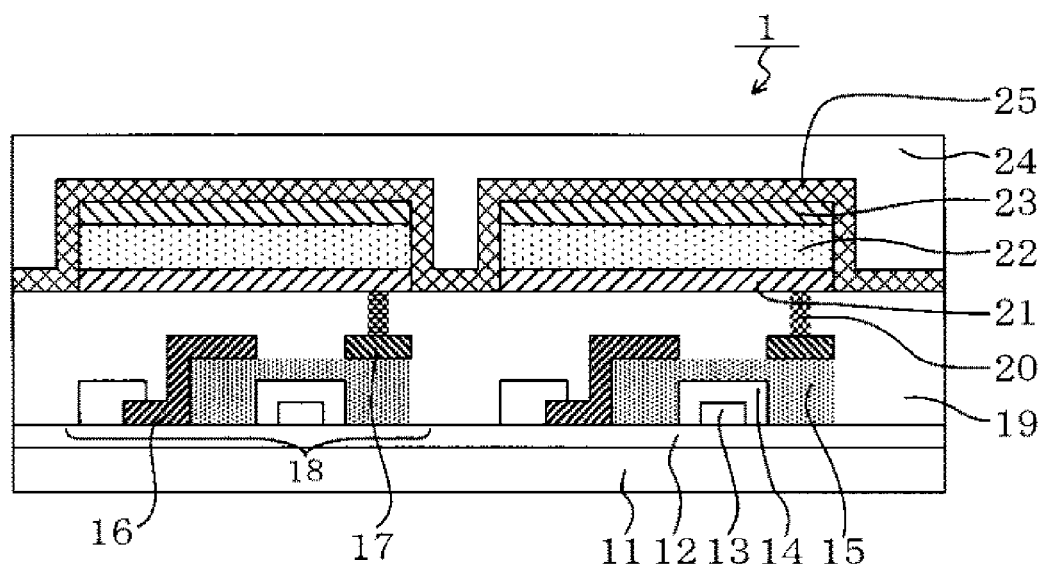

ORGANIC LIGHT EMITTING DEVICE

BACKGROUND OF THE INVENTION

1. Field of the Invention

The present invention relates to an organic light emitting device.

2. Description of the Related Art

An organic light emitting device is an electronic device including a pair of electrodes formed of an anode and a cathode, and organic compound layers placed between the pair of electrodes. When a voltage is applied to the pair of electrodes, a hole and an electron supplied from the electrodes recombine in an emitting layer in the organic compound layers to produce an exciton, and the organic light emitting device outputs light upon return of the exciton to its ground state.

The organic light emitting device has been attracting attention as one next-generation full-color display technology because the device has such characteristics as high-speed responsiveness, high luminous efficiency, and flexibility. Accordingly, material technology development and device technology development have been vigorously performed.

In particular, high durability against the deterioration of the organic light emitting device due to its continuous driving has been required for applying the organic light emitting device to a full-color display or the like, and hence development with a view toward the improvement of the durability has been progressed.

Japanese Patent Application Laid-Open No. 2003-077676 discloses an organic light emitting device whose durability has been improved by doping a hole transport layer constituting the organic light emitting device with rubrene, 9,10-diphenylanthracene (DPA), or an oxadiazole compound (such as OXD8).

The deterioration of the organic light emitting device is considered to be due to the action of high-energy chemical species present in the organic light emitting device (such as a hole and an electron injected from the electrodes, and an exciton produced in the organic compound layers). However, a detailed mechanism of the deterioration has not been elucidated yet.

By the way, in Japanese Patent Application Laid-Open No. 2003-077676, an attempt has been made to lengthen the lifetime of the device by doping a layer forming an emission interface where excitons are present at a high density with a specific compound, but a practically sufficient lifetime has not been obtained.

SUMMARY OF THE INVENTION

The present invention has been made to solve the problems and an object of the present invention is to provide an organic light emitting device that has high efficiency and high durability against continuous driving.

According to the present invention, there is provided an organic light emitting device, including:
an anode;
a cathode; and
organic compound layers placed between the anode and the cathode,
in which:
the organic compound layers include at least a hole transport layer and an emitting layer;
the hole transport layer and the emitting layer are in contact with each other;
the hole transport layer has an arylamine compound and an aromatic hydrocarbon compound;
the aromatic hydrocarbon compound may have an alkyl group;
the aromatic hydrocarbon compound satisfies the following requirements (i) and (ii):
(i) the compound includes a compound constituted only of carbon atom and hydrogen atom, and
(ii) the compound has a partial structure represented by one of the following general formulae (ii-1) and (ii-2);

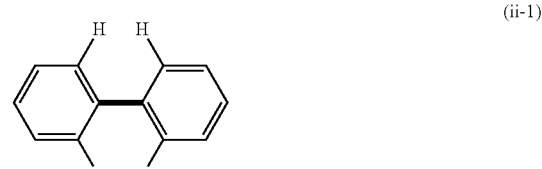

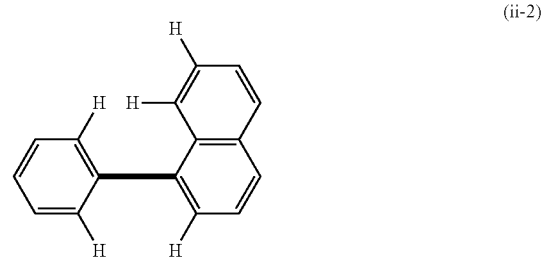

the emitting layer has a host and an electron trap dopant; and
the host and the electron trap dopant satisfy the following expressions (A) and (B):

$$|E_{LUMO}(\text{Dopant})| - |E_{LUMO}(\text{Host})| > 0.15 \text{ eV} \qquad (A)$$

$$|E_{HOMO}(\text{Host})| < |E_{HOMO}(\text{Dopant})| \qquad (B)$$

in the expressions (A) and (B), $E_{LUMO}$(Dopant) represents an LUMO energy of the electron trap dopant, $E_{LUMO}$(Host) represents an LUMO energy of the host, $E_{HOMO}$(Host) represents an HOMO energy of the host, and $E_{HOMO}$(Dopant) represents an HOMO energy of the electron trap dopant.

Further features of the present invention will become apparent from the following description of exemplary embodiments with reference to the attached drawing.

BRIEF DESCRIPTION OF THE DRAWINGS

FIG. 1 is a schematic sectional view illustrating an example of a display apparatus including an organic light emitting device and a TFT device connected to the organic light emitting device.

DESCRIPTION OF THE EMBODIMENTS

An organic light emitting device of the present invention includes: an anode; a cathode; and organic compound layers placed between the anode and the cathode, in which: the organic compound layers include at least a hole transport layer and an emitting layer; and the hole transport layer and the emitting layer are in contact with each other.

The organic compound layers constituting the organic light emitting device of the present invention are a laminate including at least the hole transport layer and the emitting layer, provided that the layer construction of the organic compound layers in the present invention is not particularly limited except for the following condition: the hole transport layer and the emitting layer are provided so as to be in contact with each other. In other words, a layer except the hole transport layer and the emitting layer may be included as a layer constituting the organic compound layers. Examples of the layer constituting the organic compound layers except the hole transport layer and the emitting layer include a hole injection layer, an electron blocking layer, a hole blocking layer, an electron transport layer, an electron injection layer, and an exciton diffusion preventing layer. It should be noted that the following embodiment is preferred in the present invention: the electron transport layer is placed between the cathode and the emitting layer so as to be in contact with the emitting layer. Here, out of layers each of which is adjacent to the emitting layer and has a function of transporting charge, a layer having a function as a certain barrier such as an HOMO energy barrier, an LUMO energy barrier, or an excitation energy barrier between itself and the emitting layer as well is sometimes called a blocking layer. Here, out of the layers called blocking layers, layers for blocking a hole, an electron, and an exciton are called the hole blocking layer, the electron blocking layer, and an exciton blocking layer, respectively. It should be noted that in the present invention, layers having the functions of the blocking layers as well are included in the category of the hole transport layer and the electron transport layer.

In addition, in the present invention, for example, a construction in which an insulative layer is provided at an interface between an electrode and the organic compound layers, a construction in which an adhesion layer or an interference layer is provided at the interface, or a construction in which the electron transport layer or the hole transport layer is constituted of two layers having different ionization potentials can be adopted as the construction of the organic light emitting device.

The organic light emitting device of the present invention may be of the so-called top emission system in which light is extracted from a side opposite to a substrate, may be of the so-called bottom emission system in which light is extracted from the side of the substrate, or can be used as a construction in which light is extracted from each of both the sides.

By the way, in the present invention, all of requirements concerning the emitting layer and requirements concerning the hole transport layer need to be satisfied.

First, the requirements concerning the emitting layer are described. The requirements concerning the emitting layer are specifically the following requirements (a-1) and (a-2):

(a-1) the emitting layer has a host and an electron trap dopant; and (a-2) the host and the electron trap dopant satisfy the following expressions (A) and (B).

$$|E_{LUMO}(\text{Dopant})| - |E_{LUMO}(\text{Host})| > 0.15 \text{ eV} \quad (A)$$

$$|E_{HOMO}(\text{Host})| < |E_{HOMO}(\text{Dopant})| \quad (B)$$

(In the expressions (A) and (B), $E_{LUMO}$(Dopant) represents the LUMO energy of the electron trap dopant, $E_{LUMO}$(Host) represents the LUMO energy of the host, $E_{HOMO}$(Host) represents the HOMO energy of the host, and $E_{HOMO}$(Dopant) represents the HOMO energy of the electron trap dopant.)

Hereinafter, the reason why the requirements (a-1) and (a-2) are required is described.

An arylamine compound is a compound that has heretofore been frequently utilized as a constituent material for the hole transport layer because of its excellent hole transportability. However, the arylamine compound has a C—N single bond that is a bond weak against deterioration due to an exciton. Accordingly, the arylamine compound is a compound weak against an exciton produced by the recombination of a hole and an electron, and the arylamine compound readily deteriorates owing to the exciton. Therefore, when the arylamine compound is used as a constituent material for the hole transport layer, measures need to be taken to prevent the deterioration of the hole transport layer due to an exciton.

Here, the organic light emitting device in which the hole transport layer and the emitting layer are adjacent to each other for efficiently transporting a hole is considered. When an emission interface in the organic light emitting device is set to an interface between the hole transport layer and the emitting layer, part of a large amount of excitons produced at the emission interface intervene in the hole transport layer, which facilitates the occurrence of the deterioration of the arylamine compound. Therefore, in consideration of the deterioration of the arylamine compound, it can be said to be desirable to locate the emission interface as away as possible from the hole transport layer instead of setting the emission interface to the interface between the hole transport layer and the emitting layer.

On the other hand, in general, a compound having a high electron mobility is suitably used in the electron transport layer. Here, a compound free of the C—N single bond is sometimes included in the compounds in the electron transport layer. Accordingly, the selection of the compound free of the C—N single bond upon formation of the electron transport layer makes it much easier to impart the durability against deterioration due to an exciton to the layer than to impart the durability to the hole transport layer.

It can be said from the foregoing that in the present invention, the emission interface is preferably located as away as possible from the hole transport layer and caused to approach the side of the electron transport layer.

By the way, the position of the emission interface in the emitting layer depends on the distribution of holes and electrons in the emitting layer at the time of the driving of the device. In other words, at a site where holes and electrons are distributed at high densities, excitons produced by the recombination of the holes and the electrons are distributed at a high density to form the emission interface. Here, in order that the emission interface in the emitting layer may be caused to approach the side of the electron transport layer, e.g., an interface between the emitting layer and the electron transport layer, the moving speed of an electron moving in the emitting layer needs to be made lower than the moving speed of a hole moving in the emitting layer. Here, a construction for trapping an electron (electron trap structure) needs to be provided in the emitting layer for reducing the moving speed of the electron moving in the emitting layer.

In the emitting layer having the electron trap structure, the holes are not trapped by the electron trap structure and hence are widely distributed in the emitting layer. On the other hand, the electrons are trapped by the electron trap structure and hence the distribution of the electrons is largely biased to the side of the cathode (or the side of the electron transport layer) in the emitting layer.

Accordingly, in the emitting layer having the electron trap structure, the emission interface is formed on the cathode side of the emitting layer where a large number of electrons are distributed, e.g., at the interface between the emitting layer and the electron transport layer. By the way, in order that the emitting layer may be provided with the electron trap structure, as described in the requirement (a-1), the emitting layer needs to be constituted of at least one kind of host and at least one electron trap dopant. Further, as described in the requirement (a-2), specifically, the relationships of the following expressions (A) and (B) need to be established for the energy levels of the host and the dopant (electron trap dopant).

$$|E_{LUMO}(\text{Dopant})|-|E_{LUMO}(\text{Host})|>0.15 \text{ eV} \qquad (A)$$

$$|E_{HOMO}(\text{Host})|<|E_{HOMO}(\text{Dopant})| \qquad (B)$$

(In the expressions (A) and (B), $E_{LUMO}$(Dopant) represents the LUMO energy of the electron trap dopant, $E_{LUMO}$(Host) represents the LUMO energy of the host, $E_{HOMO}$(Host) represents the HOMO energy of the host, and $E_{HOMO}$(Dopant) represents the HOMO energy of the electron trap dopant.)

Here, when the condition (A) is satisfied, an electron moves while being trapped by the electron trap dopant, and hence the moving speed of the electron in the emitting layer largely reduces. In addition, when the condition (B) is satisfied, a hole can move on the host in the emitting layer without being trapped by the dopant (electron trap dopant), and hence the moving speed of the hole in the emitting layer does not reduce. Therefore, satisfying the requirements (A) and (B) results in the formation of an electron trap emitting layer.

It should be noted that the HOMO energies and the LUMO energies can be experimentally determined by performing cyclic voltammetry (CV measurement). Here, an oxidation potential obtained by the CV measurement corresponds to an $|E_{HOMO}|$ and a reduction potential obtained by the measurement corresponds to an $|E_{LUMO}|$.

In addition, as is well known, when the number of electrons involved in a reaction is represented by n and Faraday's constant is represented by F, a relationship of $\Delta G=nFE$ is established between potential difference E and the free energy $\Delta G$ of the reaction. Here, $\Delta G$ equals FE in an oxidation-reduction reaction in an ordinary material for an organic light emitting device because n equals 1.

Here, dividing both sides of $\Delta G=FE$ by F yields $\Delta G/F=E$ and both of its sides are represented in eV units. That is, potential differences (unit: V) obtained by the CV measurement may be directly read as a difference in $|E_{HOMO}|$ and a difference in $|E_{LUMO}|$ represented in eV units.

In addition, a compound having an electron-withdrawing partial structure in a molecule thereof is preferred as the electron trap dopant in the emitting layer because the $|E_{LUMO}(\text{Dopant})|$ can be enlarged. Herein, examples of the electron-withdrawing partial structure may include: a fluoranthene skeleton such as fluoranthene or benzofluoranthene; a nitrogen-containing hetero ring having a pyridine skeleton such as pyridine, pyrimidine, triazine, quinoline, or isoquinoline; and an electron-withdrawing substituent such as a halogen atom, a cyano group, a nitro group, at trihalomethyl group, a carboxy group, or a sulfonyl group. It should be noted that in the present invention, the electron-withdrawing partial structure is not limited to the above-mentioned compounds.

Of the compounds, a hydrocarbon compound having a fluoranthene skeleton as a partial structure is particularly preferred because the compound has a large $|E_{LUMO}|$ and is chemically stable. In addition, the hydrocarbon compound having a fluoranthene skeleton as a partial structure is particularly preferred as the electron trap dopant because the compound is advantageous from the viewpoints of the durability and luminous efficiency of the organic light emitting device.

As described in the foregoing, in the present invention, the emitting layer can be turned into an electron trap emitting layer by satisfying the requirements (a-1) and (a-2) in the emitting layer, and the emission interface can be distributed to the side of the electron transport layer (e.g., the interface between the emitting layer and the electron transport layer). Therefore, electrons injected and transported from the side of the cathode are trapped on the electron trap dopant, and hence most of the electrons are recombined and consumed on the side of the electron transport layer (e.g., the interface between the emitting layer and the electron transport layer).

Next, the requirements concerning the hole transport layer are described. The requirements concerning the hole transport layer are specifically the following requirements (b-1) and (b-2):

(b-1) the hole transport layer has an arylamine compound and an aromatic hydrocarbon compound; and (b-2) the aromatic hydrocarbon compound is a compound that satisfies the following requirements (i) and (ii), and may have an alkyl group:

(i) the compound is a compound constituted only of carbon atom and hydrogen atom, and (ii) the compound has a partial structure represented by the following general formula (ii-1) or (ii-2).

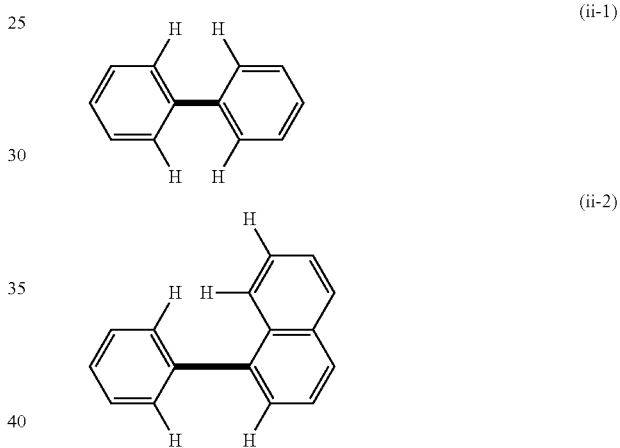

It should be noted that details about the respective requirements ((b-1) and (b-2)) are described later.

It was assumed that when the emitting layer was turned into an electron trap layer as described above, the amount of electrons reaching the hole transport layer having the arylamine compound was small and hence the influence of, for example, the leakage of the electrons on the hole transport layer formed of the arylamine compound was small.

However, the inventors of the present invention have discovered that when the hole transport layer is doped with a compound strong against deterioration due to excitation while the requirements (a-1) and (a-2) are satisfied for the emitting layer, the lengthening of the lifetime of the organic light emitting device is achieved contrary to expectations.

In view of the foregoing, doping the hole transport layer containing the arylamine with the compound strong against deterioration due to excitation (compound having high durability against an exciton) while satisfying the requirements ((a-1) and (a-2)) concerning the emitting layer may be effective in lengthening the lifetime of the organic light emitting device.

Here, the compound strong against deterioration due to excitation is preferably an aromatic hydrocarbon compound formed only of carbon-carbon bond and C—H single bond. This is because a typical value for the binding energy of a C—C single bond between aromatic hydrocarbons is 4 eV to 5 eV and hence the bond is stronger than a C—N single bond having a binding energy of 3 eV to 4 eV.

In addition, in the present invention, the aromatic hydrocarbon compound in the hole transport layer is preferably a compound that: has multiple monovalent or more aromatic hydrocarbon skeletons each of which is unsubstituted or substituted with an alkyl group; and is obtained by bonding the multiple aromatic hydrocarbons with a single bond. Specifically, as described in the item (ii) of the requirement (b-2), the compound is preferably a compound having the partial structure represented by the following general formula (ii-1) or (ii-2).

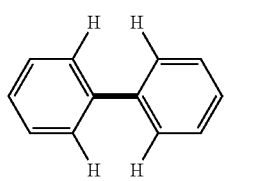
(ii-1)

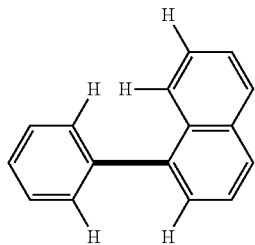
(ii-2)

Even when the aromatic hydrocarbon compound having the partial structure represented by the general formula (ii-1) or (ii-2) is excited to cause the radical cleavage of a single bond represented in the formula (thick line portion), steric hindrance around the single bond is small. Accordingly, a produced pair of radicals easily causes recombination to return to the original compound and hence the compound is strong against deterioration due to excitation. On the other hand, when an aromatic hydrocarbon compound containing none of the partial structures represented by the general formulae (ii-1) and (ii-2) is excited to cause the radical cleavage of a single bond in its skeleton, steric hindrance around the single bond enlarges. Accordingly, the recombination of a produced pair of radicals hardly occurs. A radical that could not recombine remains as a free radical in the organic compound layers such as the hole transport layer. Here, the free radical is chemically active, and hence the compound serving as a constituent material for the organic compound layers undergoes a chemical reaction with the free radical to cause the deterioration of the organic compound layers.

By the way, the partial structures represented by the general formulae (ii-1) and (ii-2) are more specifically structures represented by the following formulae (ii-1a) and (ii-2a), respectively.

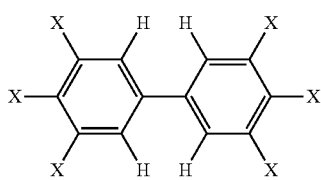
(ii-1a)

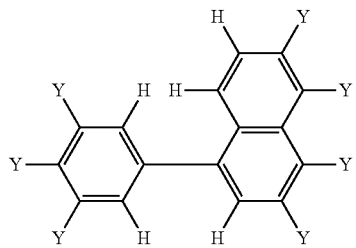
(ii-2a)

In the formula (ii-1a), X represents a hydrogen atom, an alkyl group, or an aromatic hydrocarbon group. In addition, multiple X's in the formula (ii-1a) may be identical to or different from one another. Further, X's adjacent to each other in the formula (ii-1a) may be bonded to form a cyclic structure newly. It should be noted that when X represents an aromatic hydrocarbon group, a partial structure formed by the basic skeleton and X's of the formula (ii-1a) is the partial structure represented by the general formula (ii-1) or (ii-2). On the other hand, details about X and the new cyclic structure formed by the bonding of X's adjacent to each other are described later.

In the formula (ii-2a), Y represents a hydrogen atom, an alkyl group, or an aromatic hydrocarbon group. In addition, multiple Y's in the formula (ii-2a) may be identical to or different from one another. Further, Y's adjacent to each other in the formula (ii-2a) may be bonded to form a cyclic structure newly. It should be noted that when Y represents an aromatic hydrocarbon group, a partial structure formed by the basic skeleton and Y's of the formula (ii-2a) is the partial structure represented by the general formula (ii-1) or (ii-2). On the other hand, details about Y and the new cyclic structure formed by the bonding of Y's adjacent to each other are described later.

Here, the reason why the aromatic hydrocarbon compound having the partial structure represented by the general formula (ii-1) or (ii-2) is incorporated into the hole transport layer in the present invention is described.

In order to achieve the goal of improving the durability of the organic light emitting device against continuous driving, the inventors of the present invention have investigated the mechanism of the deterioration of the organic light emitting device by use of a molecular simulation in advance, and have attempted to build an optimum device construction for improving the durability against continuous driving based on the result of the investigation.

As described in the foregoing, when a voltage is applied to the pair of electrodes constituting the organic light emitting device, a hole and an electron are supplied from these electrodes, and the supplied hole and electron recombine to produce an exciton, which causes light emission.

On the other hand, a radical cation, a radical anion, and excitons (a singlet exciton and a triplet exciton) present in the organic light emitting device upon driving of the organic light emitting device are high-energy chemical species and hence may cause various chemical reactions as well as light emission. Accordingly, the radical cation, the radical anion, and the excitons serve as factors for the deterioration of the organic light emitting device.

In view of the foregoing, the inventors of the present invention have paid attention to an energy transfer at the interface between the two layers constituting the organic compound layers attributable to the high-energy chemical species present in the organic light emitting device such as the radical cation, the radical anion, and the excitons.

The energy level of each of a hole, electron, exciton, and the like present in an organic light emitting device has heretofore been represented with a band diagram based on semiconductor theory. The band diagram has been widely used because the energy level of a material constituting the organic light emitting device can be simply found.

In consideration of a molecule itself, however, the structural change of the molecule in association with a change in electronic state occurs upon oxidation (production of a radical cation), reduction (production of a radical anion), or excitation (production of an exciton). Accordingly, an energy transfer between molecules in which a change in molecular structure due to a chemical reaction is involved cannot be sufficiently represented with the band diagram alone.

Marcus theory has been widely known as theory addressing the energy transfer between molecules in which a change in molecular structure due to a chemical reaction is involved, and energy transfers between molecules under various conditions have heretofore been experimentally and theoretically described with the Marcus theory.

Here, according to the Marcus theory, an activation energy $\Delta G^{\ddagger}$ of the process of an energy transfer from a molecule A to a molecule B is represented like the following equation (1).

$$\Delta G^{\ddagger} = \frac{(\lambda + \Delta G^{\circ})^2}{4\lambda} \quad (1)$$

In the equation (1), $\Delta G^{\circ}$ represents a difference between a free energy before the energy transfer and that after the energy transfer, and $\lambda$ represents a reorientation energy.

The $\Delta G^{\circ}$ and $\lambda$ in the equation (1) can be calculated by methods described below. It should be noted that in the following description, an electronic state before the energy transfer is referred to as "electronic state r," and an electronic state after the energy transfer is referred to as "electronic state p."

The $\Delta G^{\circ}$ is represented like the following equation (2).

$$\Delta G^{\circ} = \{\Delta G_A(p) + \Delta G_B(p)\} - \{\Delta G_A(r) + \Delta G_B(r)\} \quad (2)$$

In the equation (2), $\Delta G_A(p)$ represents an energy in the stable structure of the molecule A in the electronic state p and $\Delta G_B(p)$ represents an energy in the stable structure of the molecule B in the electronic state p.

In the equation (2), $\Delta G_A(r)$ represents an energy in the stable structure of the molecule A in the electronic state r and $\Delta G_B(r)$ represents an energy in the stable structure of the molecule B in the electronic state r.

In addition, the $\lambda$ is represented like the following equation (3).

$$\lambda = \lambda_A + \lambda_B \quad (3)$$

In the equation (3), $\lambda_A$ represents the reorientation energy of the molecule A and is represented like the following equation (4).

$$\lambda_A = \Delta G_A(p@r) - \Delta G_A(p) \quad (4)$$

In the equation (4), $\Delta G_A(p@r)$ represents the energy of the molecule A in the electronic state p calculated with reference to the stable structure of the molecule A in the electronic state r.

In the equation (3), $\lambda_B$ represents the reorientation energy of the molecule B and is represented like the following equation (5).

$$\lambda_B = \Delta G_B(p@r) - \Delta G_B(p) \quad (5)$$

In the equation (5), $\Delta G_B(p@r)$ represents the energy of the molecule B in the electronic state p calculated with reference to the stable structure of the molecule B in the electronic state r.

Here, the parameters shown in the foregoing description, i.e., the $\Delta G_A(r)$, the $\Delta G_B(r)$, the $\Delta G_A(p)$, the $\Delta G_B(p)$, the $\Delta G_A(p@r)$, and the $\Delta G_B(p@r)$ can be determined by a molecular simulation such as a molecular orbital method.

Here, the $\Delta G^{\circ}$, the $\lambda$, and the $\Delta G^{\ddagger}$ were calculated by employing the molecular orbital method based on the equation (1) to the equation (5).

In addition, when the calculation by the molecular orbital method was carried out, it was performed by Gaussian 09 widely employed at present (Gaussian 09, Revision A. 02, M. J. Frisch, G. W. Trucks, H. B. Schlegel, G. E. Scuseria, M. A. Robb, J. R. Cheeseman, G. Scalmani, V. Barone, B. Mennucci, G. A. Petersson, H. Nakatsuji, M. Caricato, X. Li, H. P. Hratchian, A. F. Izmaylov, J. Bloino, G. Zheng, J. L. Sonnenberg, M. Hada, M. Ehara, K. Toyota, R. Fukuda, J. Hasegawa, M. Ishida, T. Nakajima, Y. Honda, O. Kitao, H. Nakai, T. Vreven, J. A. Montgomery, Jr., J. E. Peralta, F. Ogliaro, M. Bearpark, J. J. Heyd, E. Brothers, K. N. Kudin, V. N. Staroverov, R. Kobayashi, J. Normand, K. Raghavachari, A. Rendell, J. C. Burant, S. S. Iyengar, J. Tomasi, M. Cossi, N. Rega, J. M. Millam, M. Klene, J. E. Knox, J. B. Cross, V. Bakken, C. Adamo, J. Jaramillo, R. Gomperts, R. E. Stratmann, O. Yazyev, A. J. Austin, R. Cammi, C. Pomelli, J. W. Ochterski, R. L. Martin, K. Morokuma, V. G. Zakrzewski, G. A. Voth, P. Salvador, J. J. Dannenberg, S. Dapprich, A. D. Daniels, O. Farkas, J. B. Foresman, J. V. Ortiz, J. Cioslowski, and D. J. Fox, Gaussian, Inc., Wallingford Conn., 2009).

Density functional theory (DFT) widely employed at present was employed as a calculation approach. An $\omega$B97X was used as a functional and a 6-31+G* was used as a basis function. It should be noted that a functional that has heretofore been used is known to involve a problem concerning the result of the calculation of a system having an electron (such as an unpaired electron of a radical anion) far away from an atomic nucleus. In contrast, the functional ($\omega$B97X) is an approach that has corrected the problem, and has been known as one long-range corrected DFT (LC-DFT). Here, the LC-DFT is particularly preferred as an approach to calculating the energy transfer of an organic light emitting device because the LC-DFT provides a highly accurate calculated value for a radical anion for which sufficient calculation accuracy is not obtained by a conventional method.

By the way, a calculated value obtained by the density functional theory typically corresponds to a value for an isolated molecule in a vacuum. However, a molecule in an organic light emitting device is present in a thin-film state. Here, the molecule present in the thin-film state is affected by other molecules present around itself unlike the isolated molecule in the vacuum.

Therefore, it can be said to be more proper to use a numerical value taking a thin-film state into consideration upon calculation of the $\Delta G^{\circ}$, the $\lambda$, and the $\Delta G^{\ddagger}$ by use of the density functional theory.

A point to be considered as a difference between a vacuum and a thin film is a difference in dielectric constant. Although the relative dielectric constant of the vacuum is 1, the relative dielectric constant of the thin film has a value of about 2 to 4 in a typical organic light emitting device material. Such difference in dielectric constant affects the parameters (the $\Delta G_A(r)$, the $\Delta G_B(r)$, the $\Delta G_A(p)$, the $\Delta G_B(p)$, the $\Delta G_A(p@r)$, and the $\Delta G_B(p@r)$. Therefore, a value taking the dielectric constant of a molecule in a thin-film state into consideration is preferably used for each of those parameters.

An energy value taking a dielectric constant into consideration can be calculated by solvent effect calculation included in the Gaussian 09. In the present invention, the solvent effect calculation was performed by performing single-point energy calculation through the addition of the keyword SCRF of the Gaussian 09. Here, a parameter such as a relative dielectric constant is needed upon performance of the solvent effect calculation. No parameter for a thin film is included in the solvent effect calculation and hence a compound having a relative dielectric constant of about 2 to 4 needs to be used as a substitute for such parameter. Accordingly, in the following description, a parameter for toluene (having a relative dielectric constant of 2.3741) is utilized.

Another point to be considered as a difference between the vacuum and the thin film is that molecules are present in an agglomerated state in the thin film unlike in the vacuum. Particularly in the case where charged species such as a cation and an anion are present so as to be close to each other, a Coulomb interaction between the species cannot be neglected. Such Coulomb interaction has an influence mainly on the value for the difference $\Delta G°$ between the free energy before the energy transfer and that after the energy transfer. Therefore, in the case where the charged species are present so as to be close to each other, the value for the $\Delta G°$ needs to be appropriately corrected in consideration of a potential energy attributable to the Coulomb interaction. Here, the case where the charged species are present so as to be close to each other is specifically each of the case where both the molecule A and molecule B before the energy transfer are charged species, and the case where both the molecule A and molecule B after the energy transfer are charged species.

In contrast, in the case where the charged species are not close to each other, i.e., in each of the case where one of the molecule A and molecule B before the energy transfer is not a charged species, the case where one of the molecule A and molecule B after the energy transfer is not a charged species, and the case where none of the molecule A and the molecule B is a charged species, the correction of the $\Delta G°$ taking the Coulomb interaction into consideration is unnecessary.

Upon performance of the correction in consideration of the Coulomb interaction, the radius of a molecule is calculated with the most stable structure of the molecule calculated by the density functional theory, and then a potential energy U attributable to the Coulomb force is calculated by using the following equation (6) on the assumption that charged species are close to each other.

$$U = \frac{q_A q_B}{4\pi\varepsilon_0 \varepsilon_r (r_A + r_B)} \quad (6)$$

In the equation (6), $q_A$ and $q_B$ represent the charges of the molecule A and the molecule B, respectively, and when elementary charge is represented by e, the charge of a cationic species is represented by e and the charge of an anionic species is represented by −e in ordinary cases, $\varepsilon_0$ represents the dielectric constant of a vacuum, $\varepsilon_r$ represents a relative dielectric constant (here, 2.3741), and $r_A$ and $r_B$ represent the molecular radii of the molecule A and the molecule B, respectively. It should be noted that the molecular radii can each be calculated by using the following equation (7) while approximating the shape of the molecule to a sphere.

$$r = \sqrt[3]{\frac{3V}{4\pi}} \quad (7)$$

In the equation (7), V represents the van der Waals volume of a molecule and r represents the radius of the molecule.

By the way, upon determination of the van der Waals volume of a molecule, calculation was performed with a Connolly Solvent Excluded Volume included in a ChemBio3D Ultra 12.0 by setting a Probe Radius to 0.001. In addition, when correction taking an intermolecular Coulomb force into consideration was needed, the correction was performed by calculating the potential energy U from the equation (6) and then adding the determined value for the U to the $\Delta G°$.

The inventors of the present invention have conducted extensive investigations on various energy transfer processes that may occur in an organic light emitting device by bringing calculation based on the Marcus theory and the density functional theory into play.

As a result, the inventors have discovered that the recombination of the radical cation (ArN·⁺) of an arylamine (ArN) present mainly in a hole transport layer and the radical anion (D·⁻) of an emitting dopant (D) can easily produce the triplet exciton ($^3$(ArN)*) of the arylamine.

More specifically, the result of the calculation based on the Marcus theory and the density functional theory has shown that the $\Delta G^\ddagger$ of an energy transfer reaction represented by the following reaction formula is substantially zero.

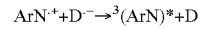

$\Delta G^\ddagger$'s were calculated for cases where arylamines and emitting dopants shown below were combined according to combinations shown in Table 1 below as specific examples.

HT-1

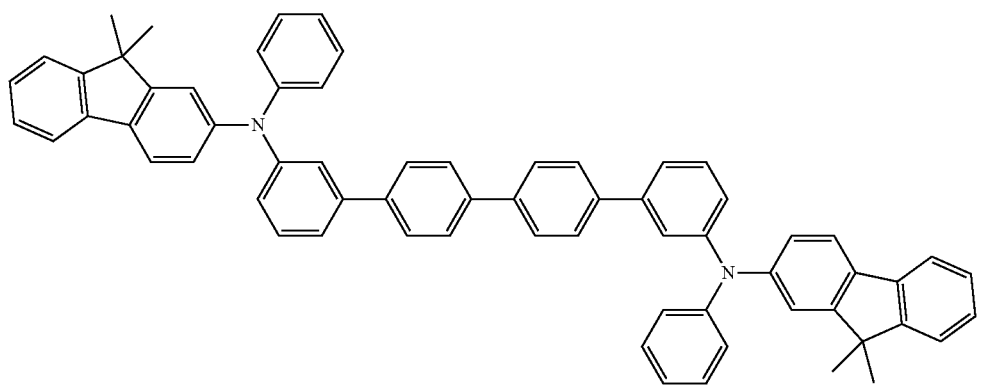

-continued
HT-2
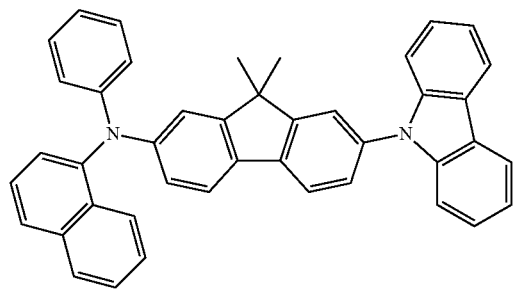
HT-3
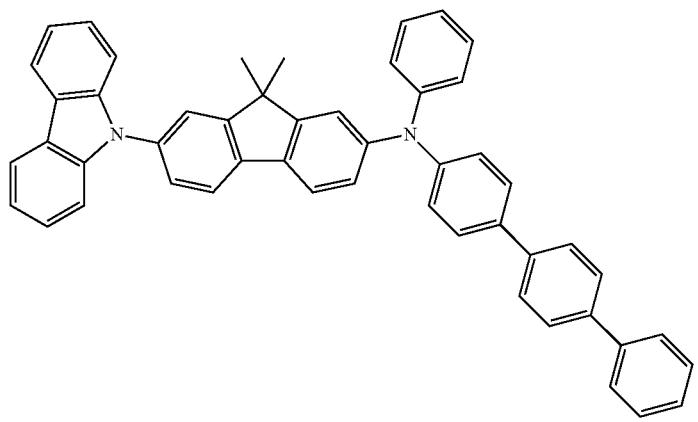
D-1
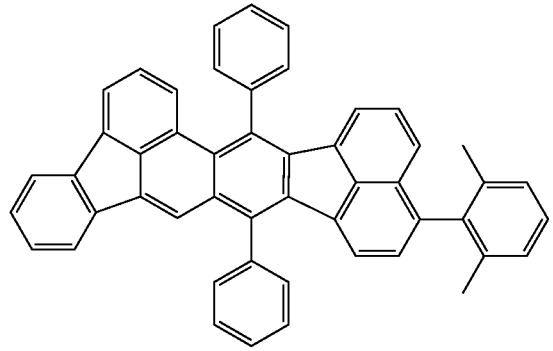
D-2
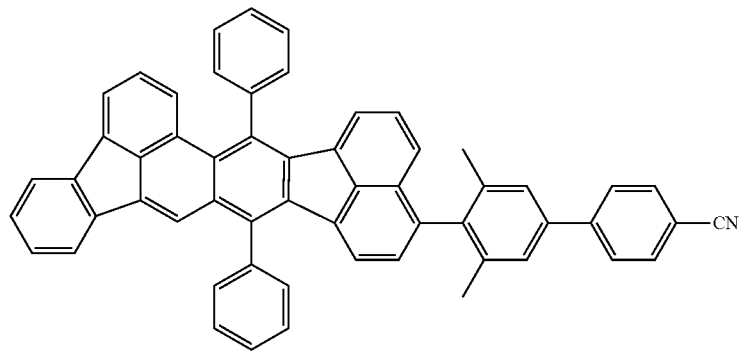
TABLE 1
| Arylamine | Emitting dopant | Molecular radius [Å] Arylamine | Molecular radius [Å] Emitting dopant | U [eV] | ΔG° [eV] | λ [eV] | ΔG‡ [eV] |
|---|---|---|---|---|---|---|---|
| HT-1 | D-1 | 5.72 | 5.06 | −0.56 | −1.14 | 1.35 | 0.01 |
| HT-1 | D-2 | 5.72 | 5.29 | −0.55 | −1.07 | 1.36 | 0.02 |
TABLE 1-continued
| Arylamine | Emitting dopant | Molecular radius [Å] Arylamine | Molecular radius [Å] Emitting dopant | U [eV] | ΔG° [eV] | λ [eV] | ΔG‡ [eV] |
|---|---|---|---|---|---|---|---|
| HT-2 | D-1 | 4.92 | 5.06 | −0.61 | −0.88 | 1.04 | 0.01 |
| HT-2 | D-2 | 4.92 | 5.29 | −0.59 | −0.81 | 1.05 | 0.01 |

TABLE 1-continued

| Arylamine | Emitting dopant | Molecular radius [Å] Arylamine | Molecular radius [Å] Emitting dopant | U [eV] | ΔG° [eV] | λ [eV] | ΔG‡ [eV] |
|---|---|---|---|---|---|---|---|
| HT-3 | D-1 | 5.20 | 5.06 | −0.59 | −0.58 | 0.47 | 0.01 |
| HT-3 | D-2 | 5.20 | 5.29 | −0.58 | −0.52 | 0.49 | 0.00 |

A hole transport layer constituting an organic light emitting device is required to have high hole transportability for obtaining high-efficiency light emission. Accordingly, an arylamine compound having a low ionization potential and a high hole mobility has been frequently used because the compound is useful in practical use as a constituent material for the hole transport layer.

However, the arylamine compound has a C—N single bond having a relatively weak binding energy (binding energy: 3 to 4 eV) in a molecule thereof. Accordingly, the arylamine compound is weak against a high-energy exciton and interacts with the exciton to readily cause the cleavage of the C—N bond, with the result that the compound itself decomposes. Accordingly, the compound can be a main cause for the deterioration of the organic light emitting device. The foregoing can be described from an energy transfer process at the time of a reaction between the radical cation (ArN$^{\cdot+}$) of the arylamine (ArN) and the radical anion (D$^{\cdot-}$) of the emitting dopant (D) represented by the reaction formula. In other words, the presence of the following mechanism is strongly suggested. An interaction between the ArN$^{\cdot+}$ and the D$^{\cdot-}$ produces the triplet exciton of the arylamine compound in the hole transport layer to cause the deterioration of the arylamine due to excitation, and the organic light emitting device deteriorates owing to the deterioration due to excitation.

To block an electron and a triplet exciton to prevent them from leaking into a hole transport layer has heretofore been considered as an effective method of preventing the deterioration of the hole transport layer. In other words, the following has been performed for preventing an electron from leaking from an emitting layer into the hole transport layer. A compound having a higher LUMO energy than that of a compound constituting the emitting layer is introduced as a constituent material for the hole transport layer to provide an electron-transfer barrier between the emitting layer and the hole transport layer. In addition, the introduction of a compound having a higher lowest triplet excitation energy ($T_1$ energy) than that of the compound constituting the emitting layer as a constituent material for the hole transport layer has been performed for preventing a triplet exciton from leaking from the emitting layer into the hole transport layer. This is because the introduction establishes a state where an exciton-transfer barrier ($T_1$ barrier) is provided between the emitting layer and the hole transport layer.

In view of the foregoing, the five compounds shown in the foregoing (HT-1, HT-2, HT-3, D-1, and D-2) were examined for their LUMO energies and $T_1$ energies. Here, the LUMO energy of a compound can be mathematically estimated by determining a difference in energy between the ground state and radical anion state of the compound, i.e., its electron affinity. In addition, the $T_1$ energy of a compound can be determined by calculation as long as a difference in energy between the ground state and $T_1$ state of the compound is determined.

The electron affinity and $T_1$ energy of each of the compounds can be determined by employing the density functional theory. In this embodiment, calculation was performed by the methods employed in the energy transfer process calculation (the ωB97X/6-31+G* and the SCRF were used in combination). Table 2 below shows the results of the calculation.

TABLE 2

| Compound | Electron affinity [eV] | $T_1$ energy [eV] |
|---|---|---|
| HT-1 | −1.08 | 2.94 |
| HT-2 | −1.02 | 2.55 |
| HT-3 | −1.02 | 2.84 |
| D-1 | −1.79 | 2.36 |
| D-2 | −1.87 | 2.36 |

A first point to be noted in Table 2 is that the electron affinity of each of the arylamine compounds (HT-1, HT-2, and HT-3) is smaller than the electron affinity of each of the dopants (D-1 and D-2). The foregoing means that an electron-transfer barrier from a dopant to an arylamine compound is large. Therefore, it can be said that an electron seldom leaks from the dopant into the arylamine compound in consideration of their electron affinities (LUMO energies).

A second point to be noted in Table 2 is that the $T_1$ energy of each of the arylamine compounds is larger than the $T_1$ energy of each of the dopants. The foregoing means that a $T_1$ barrier from a dopant compound to an arylamine compound is large. Therefore, it can be said that a triplet exciton seldom leaks from the dopant compound into the arylamine compound in consideration of their $T_1$ energies.

However, the results of Table 1 show that an interaction (recombination) between the radical anion of the dopant present in the emitting layer and the radical cation of the arylamine constituting the hole transport layer easily produces the triplet exciton of the arylamine.

On the other hand, as can be seen from Table 1 and Table 2, in an arylamine compound and a dopant, the triplet exciton of the arylamine is produced by their recombination process irrespective of their difference in LUMO energy and difference in $T_1$ energy shown in Table 2. The foregoing can be said to be the very point to be particularly noted.

It can be said from the foregoing that the method involving providing the electron-transfer barrier based on the difference in LUMO energy and the $T_1$ barrier based on the difference in $T_1$ energy, which has heretofore been performed, cannot sufficiently prevent the production of the triplet exciton of the arylamine, and hence the deterioration of the hole transport layer is inevitable.

In view of the foregoing, the inventors of the present invention have investigated the building of an optimum device construction for improving durability against continuous driving based on the mechanism of the deterioration of the hole transport layer resulting from the production of the exciton of the arylamine represented by the following reaction formula.

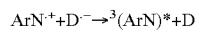

$$ArN^{\cdot+}+D^{\cdot-}\rightarrow{}^3(ArN)^*+D$$

As a result of an extensive investigation conducted by the inventors of the present invention, the lengthening of the lifetime of the organic light emitting device was able to be achieved by further doping the inside of the hole transport layer with a compound strong against deterioration due to excitation on the precondition that the emitting layer was turned into an electron trap emitting layer and the emission interface was located as away as possible from the hole transport layer as described in the foregoing.

Here, the compound with which the inside of the hole transport layer is doped is specifically an aromatic hydrocarbon compound satisfying the following requirements (i) and (ii):

(i) the compound is a compound constituted only of carbon atom and hydrogen atom, and
(ii) the compound has a partial structure represented by one of the following general formulae (ii-1) and (ii-2).

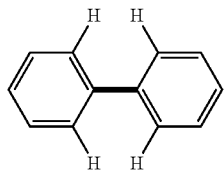

(ii-1)

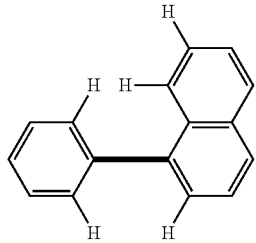

(ii-2)

It should be noted that the partial structures represented by the general formulae (ii-1) and (ii-2) are more specifically structures represented by the following formulae (ii-1a) and (ii-2a), respectively.

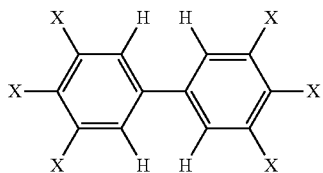

(ii-1a)

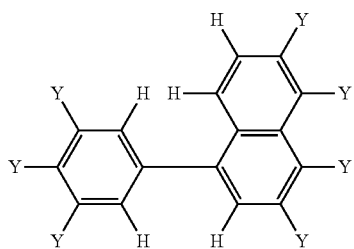

(ii-2a)

In the formula (ii-1a), X represents a hydrogen atom, an alkyl group, or an aromatic hydrocarbon group.

Examples of the alkyl group represented by X include a methyl group, a methyl-$d_1$ group, a methyl-$d_3$ group, an ethyl group, an ethyl-$d_5$ group, an n-propyl group, an n-butyl group, an n-pentyl group, an n-hexyl group, an n-heptyl group, an n-octyl group, an n-decyl group, an iso-propyl group, an iso-propyl-$d_7$ group, an iso-butyl group, a sec-butyl group, a tert-butyl group, a tert-butyl-$d_9$ group, an iso-pentyl group, a neopentyl group, a tert-octyl group, a cyclopentyl group, and a cyclohexyl group. It should be understood that the alkyl group is not limited thereto.

In addition, multiple X's in the formula (ii-1a) may be identical to or different from one another.

Further, X's adjacent to each other in the formula (ii-1a) may be bonded to form a cyclic structure newly. Specific examples of the cyclic structure to be newly formed in this case include naphthalene, anthracene, triphenylene, phenanthrene, pyrene, dibenzo[f,j]picene, chrysene, benzo[e]pyrene, benzo[g]chrysene, benzo[c]phenanthrene, dibenzo[fg,op]naphthacene, dibenzo[a,c]anthracene, picene, dibenzo[g,p]chrysene, dibenzo[hi,uv]hexacene, benzo[a]anthracene, benzo[ghi]perylene, benzo[c]chrysene, tribenzo[a,c,h]anthracene, naphtho[2,3-h]pentaphene, benzo[b]chrysene, dibenzo[a,h]anthracene, dibenzo[c,g]chrysene, dibenzo[a,i]anthracene, dibenzo[c,g]phenanthrene, dibenzo[ij,no]tetraphene, benzo[s]picene, 9,9-dimethyl-9H-fluorene, 13,13-dimethyl-13H-dibenzo[a,g]fluorene, 7,7-dimethyl-7H-dibenzo[b,g]fluorene, 7,7-dimethyl-7H-dibenzo[c,g]fluorene, fluoranthene, benzo[k]fluoranthene, benzo[e]acephenanthrylene, and naphtho[2,3-e]phenanthrylene. It should be understood that the cyclic structure is not limited thereto. Of those cyclic structures, naphthalene, phenanthrene, or 9,9-dimethyl-9H-fluorene is preferred.

It should be noted that when X represents an aromatic hydrocarbon group, a partial structure formed by the basic skeleton and X's of the formula (ii-1a) is the partial structure represented by the general formula (ii-1) or (ii-2).

In the formula (ii-2a), Y represents a hydrogen atom, an alkyl group, or an aromatic hydrocarbon group.

Examples of the alkyl group represented by Y include a methyl group, a methyl-$d_1$ group, a methyl-$d_3$ group, an ethyl group, an ethyl-$d_5$ group, an n-propyl group, an n-butyl group, an n-pentyl group, an n-hexyl group, an n-heptyl group, an n-octyl group, an n-decyl group, an iso-propyl group, an iso-propyl-$d_7$ group, an iso-butyl group, a sec-butyl group, a tert-butyl group, a tert-butyl-$d_9$ group, an iso-pentyl group, a neopentyl group, a tert-octyl group, a cyclopentyl group, and a cyclohexyl group. It should be understood that the alkyl group is not limited thereto.

In addition, multiple Y's in the formula (ii-2a) may be identical to or different from one another.

Further, Y's adjacent to each other in the formula (ii-2a) may be bonded to form a cyclic structure newly. Specific examples of the cyclic structure to be newly formed in this case include naphthalene, anthracene, triphenylene, phenanthrene, pyrene, dibenzo[f,j]picene, chrysene, benzo[e]pyrene, benzo[g]chrysene, benzo[c]phenanthrene, dibenzo[fg,op]naphthacene, dibenzo[a,c]anthracene, picene, dibenzo[g,p]chrysene, dibenzo[hi,uv]hexacene, benzo[a]anthracene, benzo[ghi]perylene, benzo[c]chrysene, tribenzo[a,c,h]anthracene, naphtho[2,3-h]pentaphene, benzo[b]chrysene, dibenzo[a,h]anthracene, dibenzo[c,g]chrysene, dibenzo[a,i]anthracene, dibenzo[c,g]phenanthrene, dibenzo[ij,no]tetraphene, benzo[s]picene, 9,9-dimethyl-9H-fluorene, 13,13-dimethyl-13H-dibenzo[a,g]fluorene, 7,7-dimethyl-7H-dibenzo[b,g]fluorene, 7,7-dimethyl-7H-dibenzo[c,g]fluorene, fluoranthene, benzo[k]fluoranthene, benzo[e]acephenanthrylene, and naphtho[2,3-e]phenanthrylene. It should be understood that the cyclic structure is not limited thereto. Of those cyclic structures, naphthalene, phenanthrene, 9,9-dimethyl-9H-fluorene, pyrene, benzo[e]pyrene, or benzo[c]phenanthrene is preferred.

It should be noted that when Y represents an aromatic hydrocarbon group, a partial structure formed by the basic skeleton and Y's of the formula (ii-2a) is the partial structure represented by the general formula (ii-1) or (ii-2).

As the aromatic hydrocarbon compound to be incorporated into the hole transport layer, a compound having a pyrene skeleton as a partial structure is particularly preferred because the synthesis thereof is easy.

Among compounds each having a pyrene skeleton, a compound represented by the following general formula [1] is preferred.

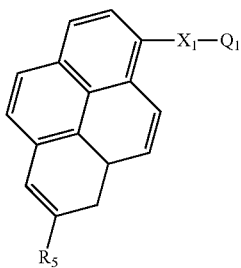

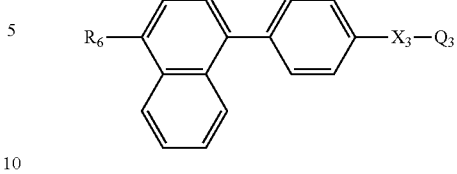

In the formula [1], $R_5$ represents a hydrogen atom or an alkyl group having 1 or more and 4 or less carbon atoms. Specific examples of the alkyl group represented by $R_5$ include a methyl group, an ethyl group, an n-propyl group, an iso-propyl group, an n-butyl group, an iso-butyl group, a sec-butyl group, and a tert-butyl group.

In the formula [1], $X_1$ represents a divalent aryl group, preferably a phenylene group, a naphthylene group, a phenanthrylene group, a fluorenylene group, or a pyrenylene group. It should be noted that the substituent represented by $X_1$ may further have an alkyl group such as a methyl group, an ethyl group, an n-propyl group, an iso-propyl group, an n-butyl group, an iso-butyl group, a sec-butyl group, or a tert-butyl group.

In the formula [1], $Q_1$ represents an aryl group, preferably a phenyl group, a naphthyl group, a phenanthryl group, a fluorenyl group, or a pyrenyl group. It should be noted that the substituent represented by $Q_1$ may further have an alkyl group such as a methyl group or a tert-butyl group, or an aryl group such as a phenyl group or a naphthyl group.

In addition, in the present invention, as the compound to be incorporated into the hole transport layer, a compound represented by the following formula [2] or formula [3] may be used instead of the compound represented by the formula [1].

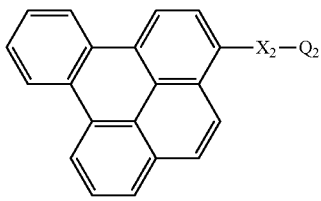

In the formula [2], $X_2$ represents a divalent aryl group, preferably a phenylene group, a naphthylene group, a phenanthrylene group, a fluorenylene group, or a pyrenylene group. It should be noted that the substituent represented by $X_2$ may further have an alkyl group such as a methyl group, an ethyl group, an n-propyl group, an iso-propyl group, an n-butyl group, an iso-butyl group, a sec-butyl group, or a tert-butyl group.

In the formula [2], $Q_2$ represents an aryl group, preferably a phenyl group, a naphthyl group, a phenanthryl group, a fluorenyl group, or a pyrenyl group. It should be noted that the substituent represented by $Q_2$ may further have an alkyl group such as a methyl group or a tert-butyl group, or an aryl group such as a phenyl group or a naphthyl group.

In the formula [3], $R_6$ represents an aryl group, preferably a phenyl group. It should be noted that the substituent represented by $R_6$ may further have an alkyl group such as a methyl group or a tert-butyl group, or an aryl group such as a phenyl group or a naphthyl group.

In the formula [3], $X_3$ represents a divalent aryl group, preferably a phenylene group, a naphthylene group, a phenanthrylene group, a fluorenylene group, or a pyrenylene group. It should be noted that the substituent represented by $X_3$ may further have an alkyl group such as a methyl group, an ethyl group, an n-propyl group, an iso-propyl group, an n-butyl group, an iso-butyl group, a sec-butyl group, or a tert-butyl group.

In the formula [3], $Q_3$ represents an aryl group, preferably a phenyl group, a naphthyl group, a phenanthryl group, a fluorenyl group, or a pyrenyl group. It should be noted that the substituent represented by $Q_3$ may further have an alkyl group such as a methyl group or a tert-butyl group, or an aryl group such as a phenyl group or a naphthyl group.

Specific examples of the organic compounds represented by the formulae [1] to [3] are shown below. It should be noted that in the present invention, the compounds are not limited to the following compounds.

HTD-1

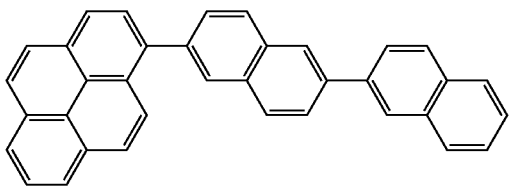

HTD-2

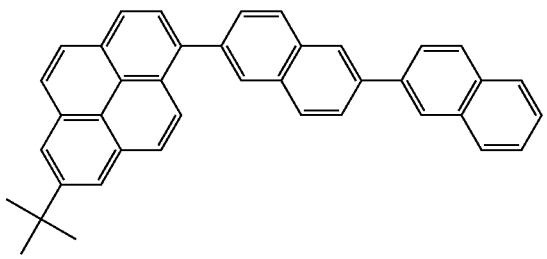

-continued

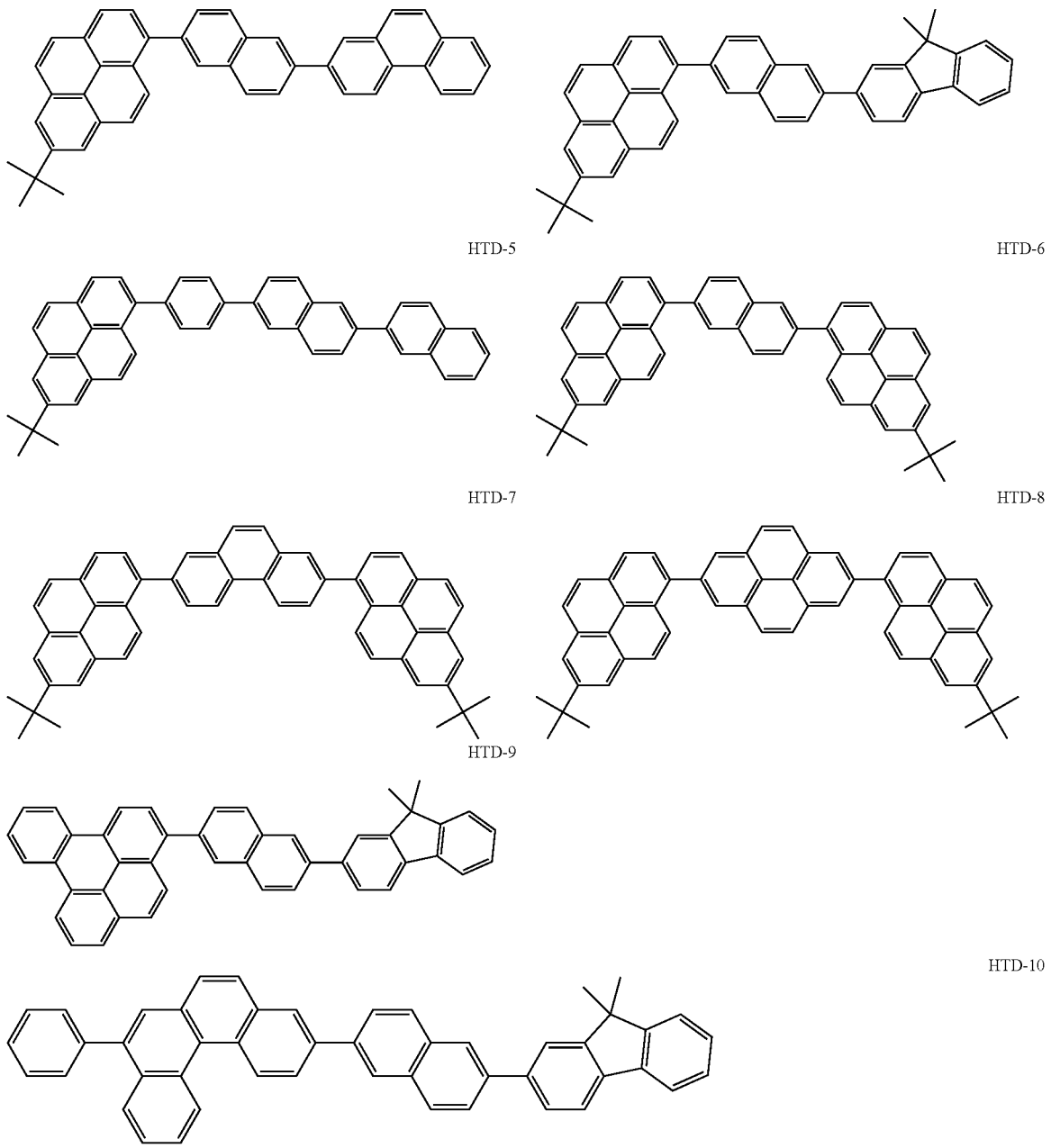

Although the aromatic hydrocarbon compounds described in the foregoing are each used as a dopant in the hole transport layer, the triplet energy level of the dopant is preferably smaller than that of the arylamine compound in the hole transport layer. In this case, a triplet excitation energy quickly transfers from the arylamine compound to the dopant and hence the deterioration of the arylamine compound due to a triplet exciton can be prevented in an additionally efficient manner.

In addition, such a compound having high triplet-triplet annihilation (TTA) efficiency as typified by an anthracene compound may be used as a host for the emitting layer. This is because it is advantageous to confine a triplet produced by TTA in the emitting layer in terms of luminous efficiency.

Here, when the compound having high TTA efficiency is used as a host for the emitting layer, the order of the triplet excitation energies of the arylamine compound, the dopant in the hole transport layer, and a constituent material for the emitting layer is preferably as follows: arylamine compound>dopant>constituent material.

It should be noted that the concentration of the dopant in the hole transport layer is preferably 0.01 wt % or more and 20 wt % or less with respect to the entirety of the layer.

A hole-injectable compound and a hole-transportable compound, a compound corresponding to the host forming the emitting layer and a light emitting compound, an electron-injectable compound and an electron-transportable compound, and the like which are conventionally known can be used together as constituent materials for the organic light emitting device of the present invention as required. It should be noted that those known compounds may be low-molecular weight compounds or may be high-molecular weight compounds.

Hereinafter, specific examples of the compounds serving as the constituent materials for the organic light emitting device of the present invention are described.

The hole-injectable material or hole-transportable material to be used as a constituent material for the hole transport layer is preferably a material that itself has a high hole mobility. Low-molecular materials and high-molecular materials each having hole injecting performance or hole transporting performance are exemplified by, but of course not limited to, a triarylamine derivative, a phenylenediamine derivative, a stilbene derivative, a phthalocyanine derivative, a porphyrin derivative, poly(vinylcarbazole), poly(thiophene), and other conductive polymers as well as the arylamine compound.

In the organic light emitting device of the present invention, the emitting layer is constituted of two or more kinds of components, i.e., a main component and an accessory component. Here, the compound having the largest weight ratio out of the compounds constituting the emitting layer is called the main component, and a compound having a smaller weight ratio than that of the main component is called the accessory component.

The material called the main component can be called a host as well.

The material called the accessory component is mainly a dopant (guest). Any other material called the accessory component is, for example, an emission assist material or a charge transport material.

It should be noted that the concentration of the guest with respect to the host is preferably 0.01 wt % or more and 20 wt % or less, more preferably 0.2 wt % or more and 5 wt % or less.

Examples of the host to be incorporated into the emitting layer include: a fluorene derivative; a naphthalene derivative; an anthracene derivative; a pyrene derivative; a carbazole derivative; a quinoxaline derivative; a quinoline derivative; an organoaluminum complex such as tris(8-quinolinolato)aluminum; an organozinc complex; a triphenylamine derivative; and a polymer derivative such as a polyfluorene derivative or a polyphenylene derivative. It should be understood that the host is not limited thereto.

As the guest to be incorporated into the emitting layer, any of a fluorescent light emitting material and a phosphorescent light emitting material may be used. Examples thereof include organometal complexes such as: iridium complexes including (2-carboxypyridyl)bis(3,5-difluoro-2-(2-pyridyl) phenyl)iridium (FIrpic), fac-tris(2-(2-pyridinyl)phenyl) iridium (Ir(ppy)$_3$), and fac-tris(1-phenylisoquinoline) iridium (Ir(piq)$_3$); platinum complexes; copper complexes; aluminum complexes; and lanthanide complexes, in addition to a fluorene derivative, a fluoranthene derivative, a chrysene derivative, an anthracene derivative, a perylene derivative, a tetracene derivative, a coumarin derivative, and a quinacridone derivative. It should be understood that the guest is not limited thereto. It should be noted that in the present invention, the guest is an electron trap dopant which traps an electron.

The electron-injectable compound to be used as the constituent material for the electron injection layer and the electron-transportable compound to be used as the constituent material for the electron transport layer are selected in consideration of, for example, a balance with the hole mobility of the hole-injectable compound or the hole-transportable compound. Examples of the electron-transportable material serving as the constituent material for the electron transport layer include an oxadiazole derivative, an oxazole derivative, a thiazole derivative, a thiadiazole derivative, a pyrazine derivative, a triazole derivative, a triazine derivative, a perylene derivative, a quinoline derivative, a quinoxaline derivative, a fluorenone derivative, an anthrone derivative, a phenanthroline derivative, fluoranthene derivative, an anthracene derivative, and an organometal complex such as a quinolinol aluminum complex. It should be understood that the electron-transportable material is not limited thereto.

In addition, examples of the electron-injectable material serving as the constituent material for the electron injection layer include an oxadiazole derivative, an oxazole derivative, a pyrazine derivative, a triazole derivative, a triazine derivative, a quinoline derivative, a quinoxaline derivative, a phenanthroline derivative, a fluoranthene derivative, an anthracene derivative, and an organic aluminum complex. It should be understood that the electron-injectable material is not limited thereto.

It is recommended that a constituent material for an anode have as large a work function as possible. Examples thereof include metal elements such as gold, platinum, silver, copper, nickel, palladium, cobalt, selenium, vanadium, and tungsten, or alloys each containing two or more kinds of these metal elements, and metal oxides such as tin oxide, zinc oxide, indium oxide, indium tin oxide (ITO), and indium zinc oxide. Further, conductive polymers such as polyaniline, polypyrrole, and polythiophene may also be used. One kind of those electrode substances may be used alone, or two or more kinds thereof may be used in combination. Further, the anode may be constructed of a single layer or may be constructed of multiple layers.

Meanwhile, it is recommended that a constituent material for a cathode have a small work function. Examples thereof include alkali metals such as lithium, alkaline earth metals such as calcium, and metal elements such as aluminum, titanium, manganese, silver, lead, and chromium. Alternatively, alloys including combinations of those metal elements may also be used. For example, magnesium-silver, aluminum-lithium, aluminum-magnesium, and the like may be used. Metal oxides such as indium tin oxide (ITO) may also be utilized. One kind of those electrode substances may be used alone, or multiple kinds thereof may be used in combination. Further, the cathode may be constructed of a single layer or may be constructed of multiple layers.

In the organic light emitting device of the present invention, each layer constituting the organic compound layers may be formed by any of various known methods. In general, the layer may be formed by a vacuum vapor deposition method, an ionization vapor deposition method, a sputtering method, or a plasma method. Alternatively, the layer may be formed by dissolving the constituent material in an appropriate solvent and subjecting the resultant to a known coating method (e.g., spin coating, dipping, a casting method, an LB method, or an ink jet method).

Here, when the layer is formed by a vacuum vapor deposition method, a solution coating method, or the like, the layer hardly undergoes crystallization and the like and is excellent in stability over time. Further, when the film is formed by a coating method, the film may also be formed in combination with an appropriate binder resin.

Examples of the binder resin include, but not limited to, a polyvinylcarbazole resin, a polycarbonate resin, a polyester resin, an ABS resin, an acrylic resin, a polyimide resin, a phenolic resin, an epoxy resin, a silicone resin, and a urea resin. Further, one kind of those binder resins may be used alone as a homopolymer or copolymer, or two or more kinds thereof may be used as a mixture. In addition, a known additive such as a plasticizer, an antioxidant, or an ultraviolet absorber may be used in combination with the binder resin, as necessary.

(Applications of Organic Light Emitting Device)

The organic light emitting device of the present invention may be used as a constituent member for a display apparatus or a lighting apparatus. In addition, the device finds applications in, for example, a light source for exposure of an electrophotographic image forming apparatus, a backlight of a liquid crystal display apparatus, and a light emitting apparatus including a white light source and a color filter. The color filter is, for example, a filter that transmits three colors, i.e., red, green, and blue.

In addition, a display apparatus of the present invention includes the organic light emitting device of the present invention in a display unit. It should be noted that the display unit includes multiple pixels.

In addition, the pixels each include the organic light emitting device of the present invention and a switching device for controlling an emission luminance or a transistor as an example of an amplifier, and the anode or cathode of the organic light emitting device and the drain electrode or source electrode of the transistor are electrically connected. Here, the display apparatus can be used as an image display apparatus for a PC or the like.

The display apparatus may be an image display apparatus that includes an image input unit for inputting image information from an area CCD, a linear CCD, a memory card, and the like, and displays the input image to the display unit.

In addition, a display unit which an imaging apparatus or an inkjet printer includes may have a touch panel function. The driving system of the touch panel function is not particularly limited.

In addition, the display apparatus may be used in the display unit of a multi-function printer.

A lighting apparatus is an apparatus for lighting, for example, the interior of a room. The lighting apparatus may emit light of any one of a white color (having a color temperature of 4,200 K), a neutral white color (having a color temperature of 5,000 K), and blue to red colors.

A lighting apparatus of the present invention includes the organic light emitting device of the present invention and a converter circuit (circuit for converting an AC voltage into a DC voltage) to be connected to the organic light emitting device. It should be noted that the lighting apparatus may further include a color filter.

Next, the display apparatus of the present invention is described with reference to the drawing. FIG. 1 is a schematic sectional view illustrating an example of a display apparatus including an organic light emitting device and a TFT device connected to the organic light emitting device. It should be noted that the organic light emitting device of the present invention is used as the organic light emitting device constituting a display apparatus 1 of FIG. 1.

The display apparatus 1 of FIG. 1 is provided with a substrate 11 such as glass and a moisture-proof film 12 for protecting a TFT device or an organic compound layer on the substrate. In addition, reference numeral 13 represents a metal gate electrode 13. Reference numeral 14 represents a gate insulating film 14 and reference numeral 15 represents a semiconductor layer 15.

A TFT device 18 includes the semiconductor layer 15, a drain electrode 16, and a source electrode 17. An insulating film 19 is provided on the TFT device 18. An anode 21 constituting the organic light emitting device and the source electrode 17 are connected through a contact hole 20.

It should be noted that the system of the electrical connection of the electrode (anode or cathode) in the organic light emitting device and the electrode (source electrode or drain electrode) in the TFT is not limited to the embodiment illustrated in FIG. 1. In other words, one of the anode and the cathode, and one of the source electrode and drain electrode of the TFT device have only to be electrically connected.

In the display apparatus 1 of FIG. 1, multiple organic compound layers are illustrated like one layer but an organic compound layer 22 may be multiple layers. Provided on a cathode 23 are a first protective layer 24 and second protective layer 25 for suppressing the deterioration of the organic light emitting device.

When the display apparatus 1 of FIG. 1 is a display apparatus that emits white light, the emitting layer in the organic compound layer 22 in FIG. 1 may be a layer obtained by mixing a red light emitting material, a green light emitting material, and a blue light emitting material. In addition, the emitting layer may be a laminated emitting layer obtained by laminating a layer formed of the red light emitting material, a layer formed of the green light emitting material, and a layer formed of the blue light emitting material. Further, alternatively, an embodiment in which the layer formed of the red light emitting material, the layer formed of the green light emitting material, and the layer formed of the blue light emitting material are arranged side by side to form a domain in one emitting layer is permitted.

Although the transistor is used as a switching device in the display apparatus 1 of FIG. 1, an MIM device may be used as a switching device instead of the transistor.

In addition, the transistor used in the display apparatus 1 of FIG. 1 is not limited to a transistor using a monocrystalline silicon wafer and may be a thin-film transistor having an active layer on the insulative surface of a substrate. A thin-film transistor using monocrystalline silicon as an active layer, a thin-film transistor using non-monocrystalline silicon such as amorphous silicon or microcrystalline silicon as an active layer, or a thin-film transistor using a non-monocrystalline oxide semiconductor such as an indium zinc oxide or an indium gallium zinc oxide as an active layer is also permitted. It should be noted that the thin-film transistor is called a TFT device as well.

The transistor in the display apparatus 1 of FIG. 1 may be formed in a substrate such as an Si substrate. Here, the phrase "formed in a substrate" means that the transistor is produced by processing the substrate itself such as the Si substrate. In other words, the presence of the transistor in the substrate can be interpreted as follows: the substrate and the transistor are integrally formed.

Whether or not the transistor is provided in the substrate is selected depending on a definition. In the case of, for example, a definition of about a QVGA per inch, the organic light emitting device is preferably provided in the Si substrate.

As described above, driving the display apparatus using the organic light emitting device of the present invention enables display that has good image quality and is stable over a long time period.

Hereinafter, the present invention is described in detail by way of examples. In this regard, however, the present invention is by no means limited to these examples.

Synthesis Example 1

Synthesis of Exemplified Compounds D-2 and D-3

Exemplified compounds D-2 and D-3 shown below were synthesized according to a synthesis method described below.

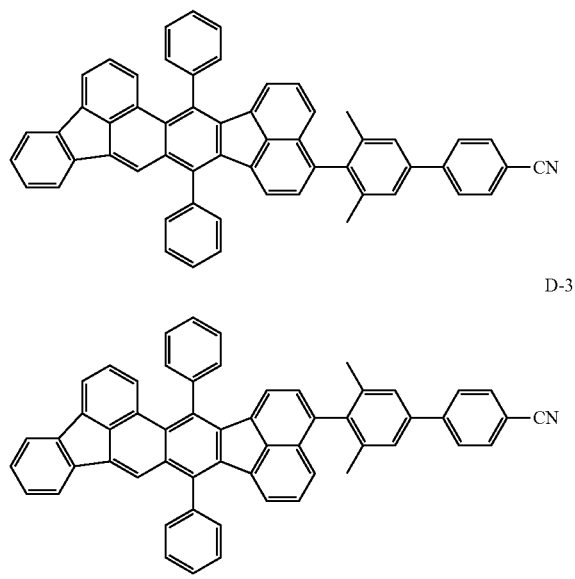

(1-1) Synthesis of Intermediate Compound M1

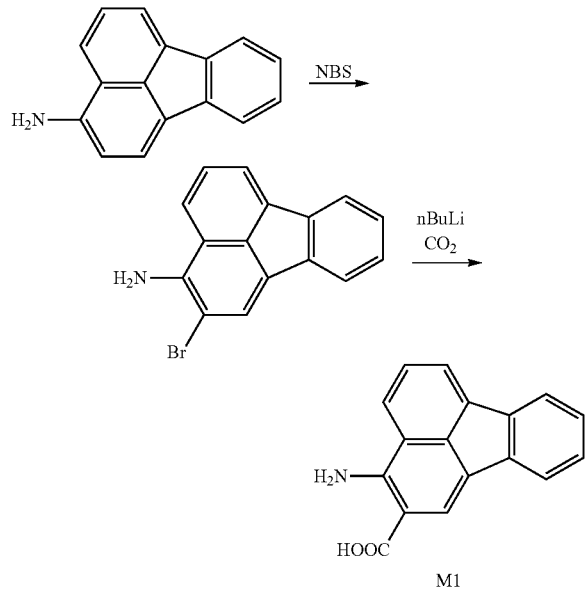

Under an argon atmosphere, the following reagent and solvent were loaded into a 2 L four-necked flask.
3-Aminofluoranthene: 45.4 g (209 mmol)
DMF: 910 mL Next, the reaction solution was cooled to 0° C. with an ice bath in a state where the inside of the reaction system was shielded from light. Next, NBS (37.2 g, 209 mmol) was added to the reaction solution and then the ice bath was removed to return the temperature of the reaction solution to room temperature. Next, the reaction solution was stirred at room temperature for 1 hour. Next, a crystal (yellowish green crystal) precipitated at the time of the pouring of the reaction solution into 2 L of ice water was taken by filtration. Next, the crystal taken by filtration was dissolved in 4 L of ethyl acetate to prepare an ethyl acetate solution, and then the ethyl acetate solution was sequentially passed through 50 g of magnesium sulfate and 500 g of Florisil to remove a raw material substance. Next, a slurry-like substance produced at the time of the concentration of the filtrate under reduced pressure was filtered to provide a crystal. Next, the resultant crystal was dried under reduced pressure to provide 54.0 g of 2-bromofluoranthene-3-amine (yield: 87.1%).

Next, under an argon atmosphere, the following reagent and solvent were loaded into a 5 L four-necked flask.
2-Bromofluoranthene-3-amine: 55.6 g (188 mmol)
Special grade cyclopentyl methyl ether: 1.12 L Next, the reaction solution was cooled to an inner temperature of 0° C. with an ice bath while the reaction solution was stirred. Next, 596 mL (939 mmol, 5 eq) of a 1.65 M solution of n-BuLi were dropped to the reaction solution over 30 minutes. Next, the temperature of the reaction solution was returned to room temperature and then the solution was stirred at the temperature (room temperature) for 3.5 hours. Next, a carbon dioxide gas was blown into the reaction system (the inner temperature of the reaction solution increased from 18° C. to 48° C. as a result of the blowing of the carbon dioxide gas) and then a gas bag was attached to the reaction system, followed by the stirring of the reaction solution overnight. Next, a 5 mol/L aqueous solution of hydrochloric acid was dropped to the reaction solution. Here, a crystal precipitated at the time of the dropping of the aqueous solution of hydrochloric acid was filtered but most of the crystal was a compound except the target product. In view of the foregoing, an organic phase obtained by subjecting the filtrate obtained at the time of the filtration to a separating operation was passed through 500 g of Florisil. Next, the residue obtained by concentrating and drying up the filtrate that had been passed through the Florisil was reprecipitated with a mixed solvent of THF and CHCl$_3$ to provide 10.5 g of a crude crystal (HPLC purity: 92%). Next, the resultant crude crystal was reprecipitated with a mixed solvent of THF and CHCl$_3$ again to provide 8.50 g of a crystal A (HPLC purity: 98%). Next, a filtrate obtained at the time of the second reprecipitation was purified by column chromatography (gel: 1 kg, eluent: heptane/ethyl acetate=1/1) to provide 900 mg of a crystal B (HPLC purity: 98%). Next, a combination of the crystal A and the crystal B was dissolved in THF to prepare a uniform solution, and then the solution was concentrated under reduced pressure to provide a slurry-like substance. Next, chloroform was added to the slurry-like substance to take out a crystal C. Next, the crystal C was dried under reduced pressure to provide 9.23 g of an intermediate compound M1 (yield: 18.6%).

(1-2) Synthesis of Intermediate Compound M2

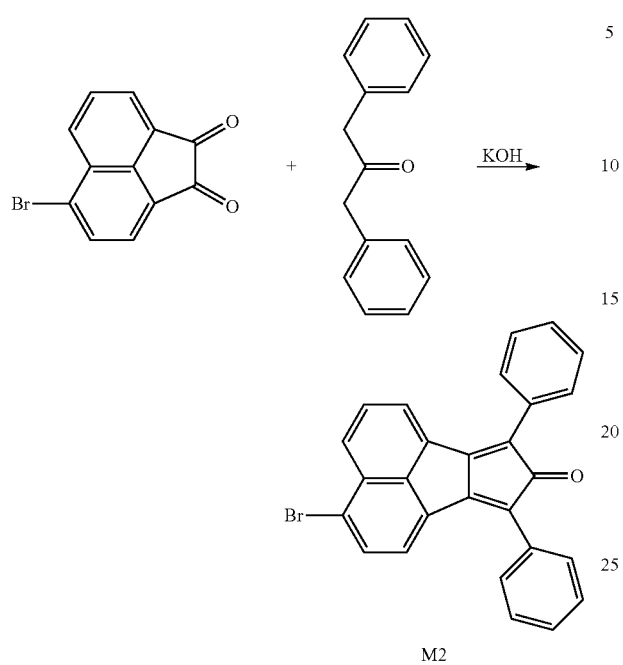

Under a nitrogen atmosphere, the following reagents and solvent were loaded into a 500 mL three-necked reaction vessel.
5-Bromo-acenaphthylene-1,2-dione: 15.0 g (57.5 mmol)
1,3-Diphenylpropan-2-one: 12.1 g (57.5 mmol)
Ethanol: 300 mL Next, 20 mL of a 6 M aqueous solution of sodium hydroxide were dropped to the reaction solution at room temperature. After the completion of the dropping, the reaction solution was heated to 60° C. and then the reaction solution was stirred at the temperature (60° C.) for about 2 hours. Next, a precipitate produced at the time of the cooling of the reaction solution to room temperature was filtered, and then the precipitate was sequentially washed with water and ethanol. Next, the precipitate was heated and dried at 80° C. under reduced pressure to provide 22.0 g of an intermediate compound M2 as a dark green solid (yield: 88%).

(1-3) Synthesis of Intermediate Compound M3 (M3-1 and M3-2)

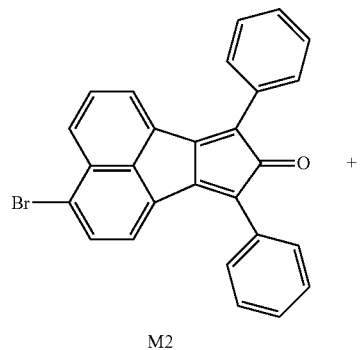

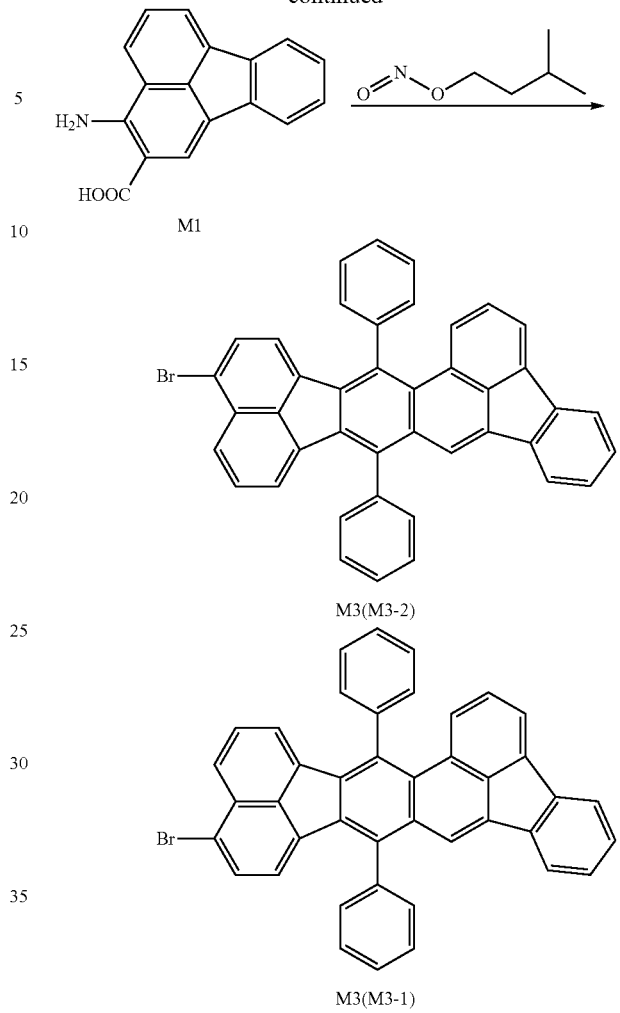

Under a nitrogen atmosphere and at room temperature, the following reagents and solvent were loaded into a 1-L three-necked reaction vessel.
Intermediate compound M2: 18.0 g (41.3 mmol)
Intermediate compound M1: 14.0 g (53.8 mmol)
Isoamyl nitrite: 8.72 g (74.4 mmol)
Toluene: 720 mL Next, the reaction solution was heated to 95° C. and then the reaction solution was stirred at the temperature (95° C.) for 1.5 hours. Next, the reaction solution was cooled and then the reaction solution was washed with 1 L of water 3 times. Next, an organic phase obtained by the washing with water was further washed with brine and was then dried with magnesium sulfate. Next, a filtrate obtained by filtering the organic phase was concentrated under reduced pressure to provide a dark brown liquid. Next, the resultant dark brown liquid was purified by column chromatography (eluent: toluene/heptane=1/3). Next, a solution obtained at the time of the purification was concentrated under reduced pressure to provide a crystal. Next, 345 mL of methanol were added to the resultant crystal and then the mixture was subjected to slurry washing under heating. After that, a crystal produced when the washed product was left standing to cool to room temperature was filtered to provide 21.9 g of an intermediate compound M3, which was a yellow crystal, as a mixture of isomers (M3-1 and M3-2) (yield: 87%).

(1-4) Synthesis of Intermediate Compound M4 (M4-1 and M4-2)

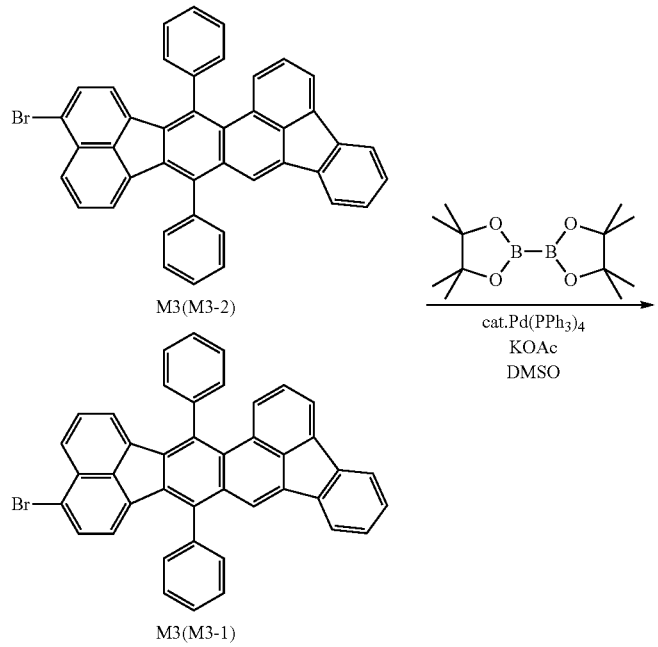

M3(M3-2)

M3(M3-1)

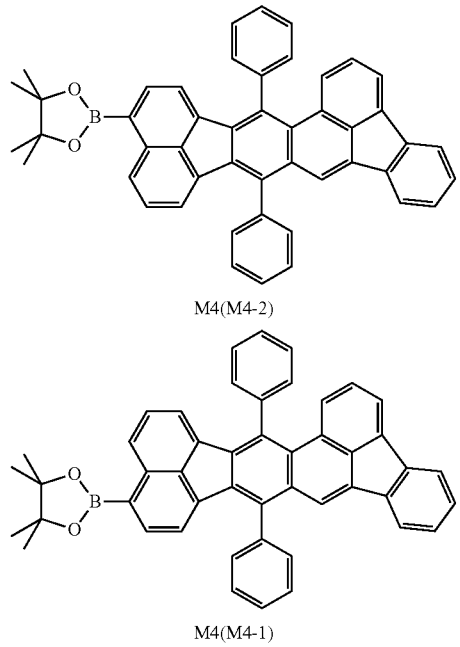

M4(M4-2)

M4(M4-1)

Under a nitrogen atmosphere, the following reagents and solvent were loaded into a 1-L three-necked vessel.
Intermediate compound M3 (mixture of M3-1 and M3-2): 19.4 g (31.9 mmol)
Bis-dioxaborolane: 16.2 g (63.9 mmol)
Potassium acetate: 6.27 g (63.9 mmol)
Tetrakis(triphenylphosphine)palladium: 1.107 g (0.96 mmol)
DMSO: 388 mL Next, the reaction solution was heated to 100° C. and then the reaction solution was stirred at the temperature (100° C.) for 1.5 hours. Next, the reaction solution was cooled to 30° C. and then 400 mL of methanol were added to the solution. Next, the reaction solution was cooled to 10° C. and then the reaction solution was stirred at the temperature (10° C.) for 1 hour, followed by filtration. Next, 800 mL of methanol were added to the filtration obtained by the filtration, and then the mixture was subjected to slurry washing under heating for 1 hour while the solvent (methanol) was refluxed. After that, the washed product was cooled to room temperature and then filtered. Thus, 18.3 g of a crude crystal of an intermediate compound M4 were obtained (yield: 87.5%). Next, a solution prepared by dissolving the resultant crude crystal in 265 mL of toluene was purified by column chromatography (eluent: toluene/heptane=1/2→toluene/heptane=1/1). Next, the purified product was subjected to slurry washing under heating with a mixed solvent of toluene and methanol to provide 9.75 g of the intermediate compound M4, which was a yellow crystal, as a mixture of isomers (M4-1 and M4-2) (yield: 46.6%).

(1-5) Synthesis of Intermediate Compound M5

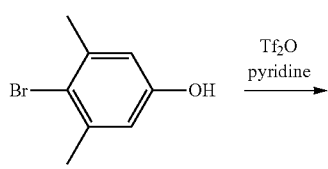

M5

Under a nitrogen atmosphere, the following reagents and solvent were loaded into a 200 mL three-necked vessel.
4-Bromo-3,5-dimethylphenol: 3.19 g (16 mmol)
Pyridine: 5.65 g (71 mmol)
Toluene: 65 mL Next, the reaction solution was cooled to 0° C. while being stirred. Next, 13.43 g (48 mmol) of trifluoromethanesulfonic anhydride were slowly dropped to the reaction solution over about 15 minutes while the reaction solution was stirred. After the completion of the dropping, the temperature of the reaction solution was increased to room temperature and then the reaction solution was stirred under room temperature for an additional one hour. Next, 100 mL of water were added to the solution to terminate the reaction, and subsequently 40 mL of toluene were added to the mixture. After that, the resultant was subjected to a separating operation to separate an organic phase. Next, the resultant organic phase was concentrated under reduced pressure and then the concentrate was purified by column chromatography (eluent: toluene). A solution obtained at this time was concentrated under reduced pressure to provide 5.94 g of a 4-bromo-3,5-dimethylphenyl-trifluoromethanesulfonic acid ester as a colorless, transparent liquid (yield: 97.1%).

Next, under a nitrogen atmosphere, the following reagents and solvent were loaded into a 500 mL three-necked flask.
4-Bromo-3,5-dimethylphenyl-trifluoromethanesulfonic acid ester: 4.90 g (14.7 mmol)
4-Cyanophenylboronic acid: 2.05 g (14.0 mmol)
Dioxane: 245 mL
Potassium carbonate: 4.07 g (29.4 mmol)
Tetrakis(triphenylphosphine)palladium: 0.17 g (0.15 mmol)

Next, the reaction solution was heated to 80° C. and then the reaction solution was stirred under the temperature (80° C.) for 1.5 hours. Next, the reaction solution was left standing to cool to room temperature. After that, 100 mL of toluene and 100 mL of water were added to the solution, and then the mixture was subjected to a separating operation to separate an organic phase. Next, the resultant organic phase was dried with magnesium sulfate, and then a filtrate obtained by filtering the organic phase was concentrated under reduced pressure to provide 4.64 g of a crude crystal, of an intermediate compound M5. Next, a solution prepared by mixing the resultant crude crystal and toluene was purified by column chromatography (eluent: toluene/heptane=1/5→toluene/heptane=1/4), and was then concentrated and dried up. Thus, 1.54 g of the intermediate compound M5 as a white crystal were obtained (yield: 37%).

(1-6) Synthesis of Exemplified Compounds D-2 and D-3

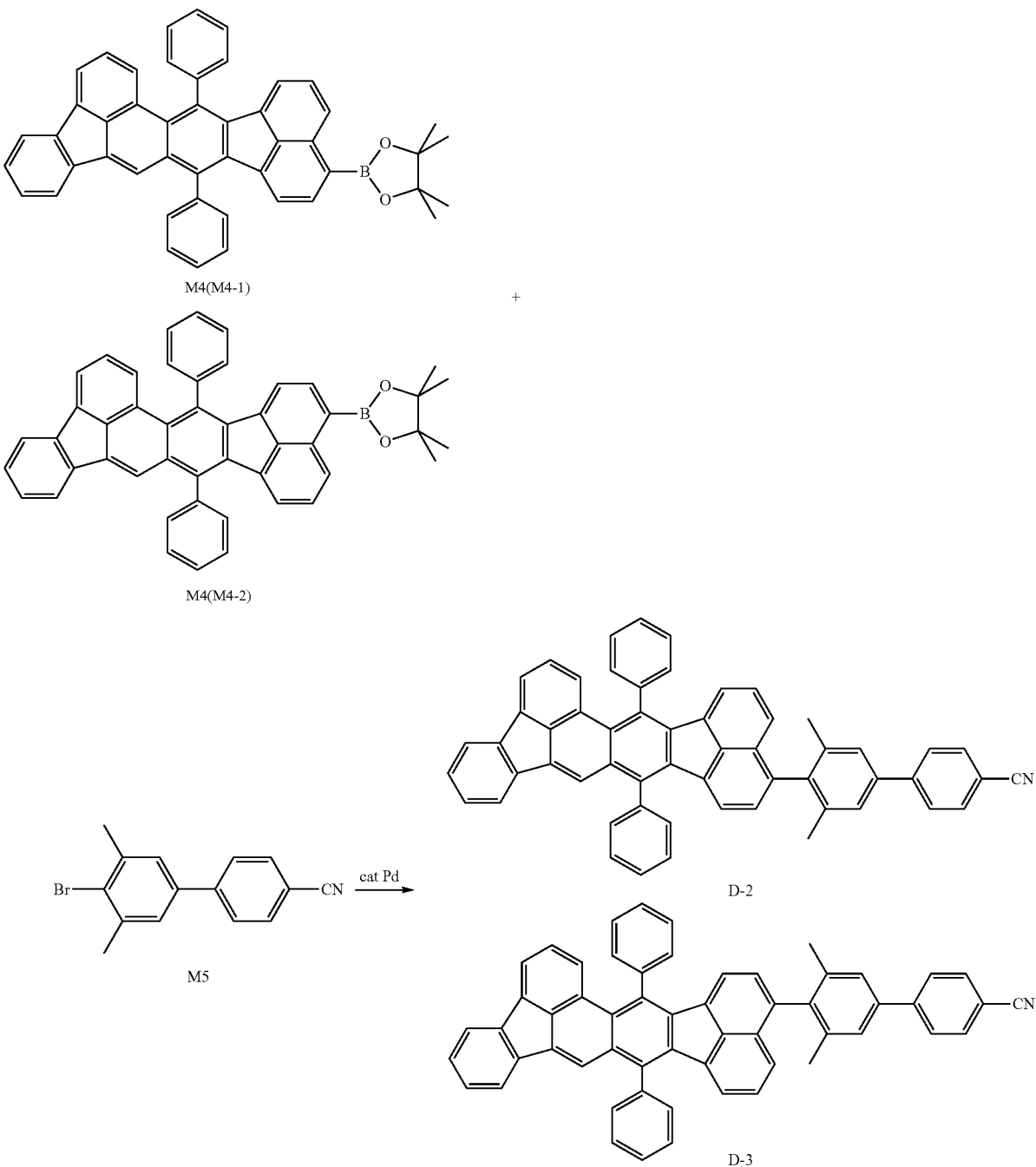

Under a nitrogen atmosphere, the following reagents and solvents were loaded into a 500 mL three-necked flask.

Intermediate compound M4 (mixture of M4-1 and M4-2): 4.40 g (6.72 mmol)

Intermediate compound M5: 1.54 g (5.38 mmol)

Toluene: 220 mL

Ethanol: 110 mL

Sodium carbonate: 1.42 g (13.4 mmol)

Water: 100 mL

Tetrakis(triphenylphosphine)palladium: 0.39 g (0.34 mmol)

Next, the reaction solution was heated to 70° C. and then the reaction solution was stirred under the temperature (70° C.) for 3 hours. Next, the reaction solution was left standing to cool to room temperature, and then the reaction solution was washed with 100 mL of water twice to provide an organic phase. Next, the organic phase was dried with magnesium sulfate, and then a filtrate obtained by filtering the solution was concentrated under reduced pressure to provide a yellow crude crystal. Next, the crude crystal was dissolved in a solvent prepared by mixing 60 mL of toluene and 60 mL of heptane, and then the solution was purified by column chromatography (eluent: toluene/heptane=1/1→toluene/heptane=2/1). Next, the solution was concentrated under reduced pressure and then methanol was added to the concentrate, followed by slurry washing under heating. Thus, 3.26 g of a mixture of the exemplified compounds D-2 and D-3 as a yellow crystal were obtained (yield: 66%). It should be noted that the exemplified compound D-2 is a product synthesized from the intermediate compound M4-1 and the exemplified compound D-3 is a product synthesized from the intermediate compound M4-2.

Example 1

(1) Production of Organic Light Emitting Device

An organic light emitting device obtained by laminating, on a substrate, an anode, a hole injection layer, a hole transport layer, an emitting layer, a hole blocking layer, an electron transport layer, and a cathode in the stated order was produced by the following method.

Indium tin oxide (ITO) was formed into a film on a glass substrate (the substrate) by a sputtering method to form the anode. At this time, the thickness of the anode was set to 115 nm. Next, the substrate on which the anode had been formed was subjected to ultrasonic cleaning with acetone and isopropyl alcohol (IPA) sequentially. Next, the cleaned product was subjected to boil cleaning with IPA, followed by drying. Further, the dried product was subjected to UV/ozone cleaning. The cleaned product was used as a transparent, conductive supporting substrate in a next step.

Next, a compound HI-1 (material for the hole injection layer) shown below and chloroform were mixed to prepare a chloroform solution having a concentration of 0.1 wt %.

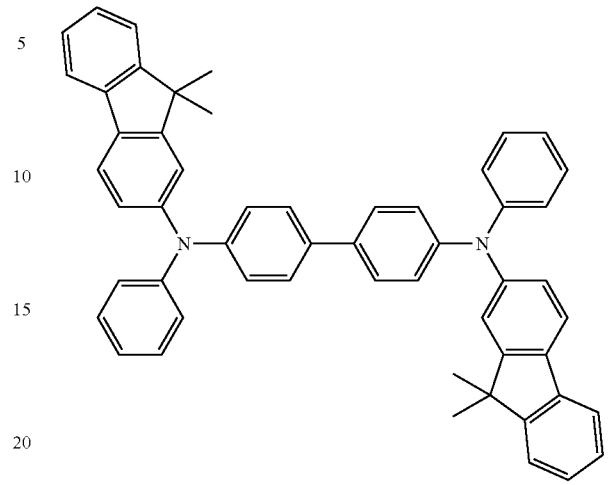

HI-1

Next, the chloroform solution was dropped on the ITO electrode. After that, spin coating was performed initially at the number of revolutions of 500 RPM for 10 seconds and then at the number of revolutions of 1,000 RPM for 1 minute to form a thin film. Next, drying was performed with a vacuum oven at 80° C. for 10 minutes to remove the solvent in the thin film completely. Thus, a first thin film was formed. The thickness of the formed first thin film was 11 nm.

Next, the compound HI-1 was formed into a film by a vacuum deposition method to form a second thin film. At this time, the thickness of the second thin film was set to 54 nm. It should be noted that a layer formed of the first thin film and the second thin film functions as the hole injection layer.

Next, a compound HT-2 (hole-transportable host, arylamine compound) shown below and a compound HTD-4 (dopant for the hole transport layer) shown below were simultaneously deposited from different boats onto the hole injection layer by the vacuum deposition method to form the hole transport layer. At this time, the concentration of the hole-transportable dopant (HTD-4) was 5 wt % with respect to the entirety of the hole transport layer, and the thickness of the hole transport layer was 45 nm.

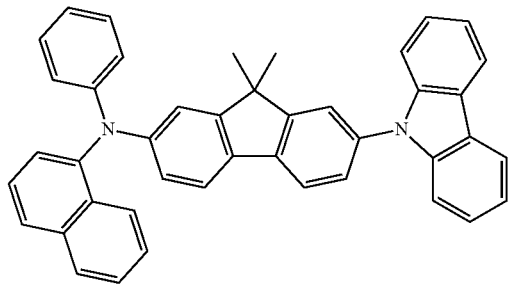

HT-2

HTD-4

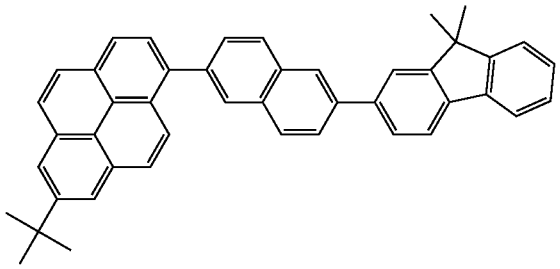

Next, a compound H-1 (host) shown below, and a 1:1 mixture of the compound D-2 (first dopant) and the compound D-3 (second dopant) were simultaneously deposited from different boats onto the hole transport layer to form the emitting layer.

H-1

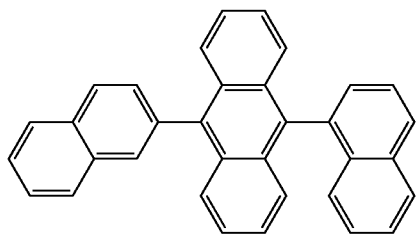

At this time, the concentration of the dopants (total of the first dopant and the second dopant) was 1.5 wt % with respect to the host (H-1), and the thickness of the emitting layer was 25 nm. It should be noted that in this example, a 1:1 mixture of the compound D-2 and the compound D-3 is used as a dopant material. This is because the compound D-2 and compound D-3 synthesized in Synthesis Example 1 cannot be separated into the compound D-2 and the compound D-3 by a purification operation to be typically performed (such as recrystallization or chromatography).

Next, a compound HB-1 shown below was formed into a film on the emitting layer by the vacuum deposition method to form the hole blocking layer. At this time, the thickness of the hole blocking layer was 5 nm.

HB-1

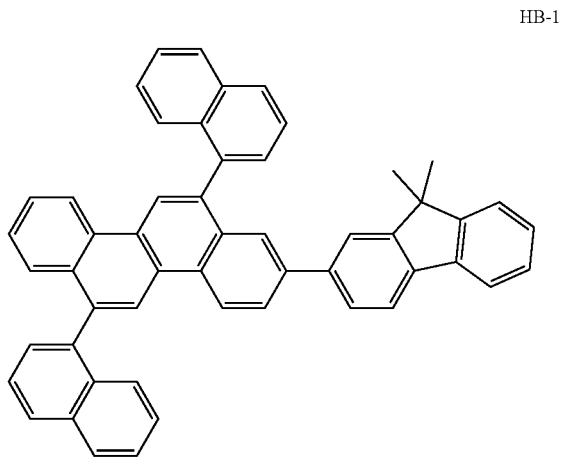 [SMILES: CC1(C)c2ccccc2-c2ccc(-c3ccc4c(c3)c(-c3cccc5ccccc35)cc3c5ccccc5c(-c5cccc6ccccc56)cc43)cc21]

Next, a compound ET-1 was deposited in a vacuum as the electron transport layer onto the hole blocking layer by the vacuum deposition method to form the electron transport layer. At this time, the thickness of the electron transport layer was 20 nm.

ET-1

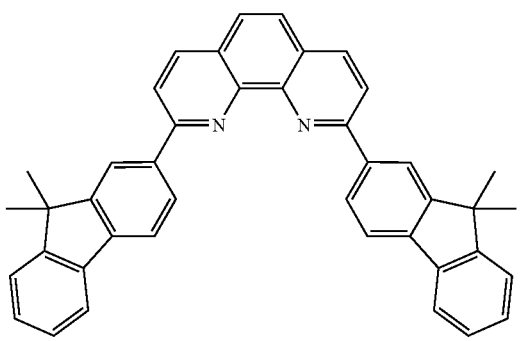

It should be noted that each layer constituting the organic compound layers (the hole injection layer, the hole transport layer, the emitting layer, the hole blocking layer, and the electron transport layer) was formed by the vacuum deposition method under the following conditions: a degree of vacuum of $7.0 \times 10^{-5}$ Pa or less, and a film formation rate of 0.08 nm/sec or more and 0.10 nm/sec or less. It should be noted that the film formation rate of the emitting layer is a rate obtained by summing the deposition rate of the host itself and the deposition rates of the dopants themselves. In addition, a vacuum state was maintained during a time period commencing on the completion of the formation of the hole transport layer and ending on the initiation of the formation of the emitting layer, and the time period (time period for which the vacuum state was maintained) was 10 minutes or less. In addition, the vacuum state was maintained during a time period commencing on the completion of the formation of the emitting layer and ending on the initiation of the formation of the electron transport layer as well, and the time period (time period for which the vacuum state was maintained) was 10 minutes or less.

Next, lithium fluoride (LiF) and aluminum were formed into films in the stated order on the electron transport layer by the vacuum deposition method to form an electron injection electrode (the cathode) formed of the LiF film and the Al film. At this time, the thickness of the LiF film was set to 0.5 nm and the thickness of the Al film was set to 100 nm. In addition, the LiF film was formed at a degree of vacuum of $1.0 \times 10^{-4}$ Pa and a film formation rate of 0.05 nm/sec. Meanwhile, the Al film was formed under the conditions of a degree of vacuum of $1.0 \times 10^{-4}$ Pa, and a film formation rate of 1.0 nm/sec or more and 1.2 nm/sec or less.

Next, the organic light emitting device was covered with a protective glass plate under a nitrogen atmosphere having a dew point of −70° C. or less so that (a constituent member of) the organic light emitting device did not adsorb moisture, followed by sealing with an epoxy-based adhesive. It should be noted that the protective glass plate was provided with excavation on the side of a surface to be bonded to the organic light emitting device and a sheet for moisture adsorption (moisture getter sheet for an organic EL, manufactured by DYNIC CORPORATION) was filled in the excavation at the time of the sealing.

(2) Evaluation

(2-1) Evaluation of Device

The device obtained by the steps described in the foregoing was observed to emit blue light when a voltage was applied while the ITO electrode was used as a positive electrode and the LiF/Al electrode was used as a negative electrode. In addition, an applied voltage at an emission luminance of 1,000 cd/m² was 4.7 V and an external quantum efficiency at a current density of 25 mA/cm² was 7.9%.

In addition, when the organic light emitting device of this example was continuously driven by applying a voltage in a state where a current density of 100 mA/cm² was maintained, a time period (LT75) required for the luminance to reduce to 75% of the initial value was 91 hours.

(2-2) Oxidation-Reduction Potentials of Host and Dopant

In the organic light emitting device of this example, the oxidation-reduction potentials of the host (H-1) and dopant (mixture in which D-2 and D-3 were mixed at 1:1) in the emitting layer were each measured by employing a cyclic voltammetry (CV) method as described below.

Specifically, an oxidation potential and a reduction potential were measured by using 0.1 mol/L tetrabutylammonium perchlorate as a supporting electrolyte under the following conditions.

(2-2-1) Oxidation Potential

The oxidation potential of each compound was measured with a solution of the compound in methylene chloride having a concentration of $1\times10^{-6}$ mol/L or more and $1\times10^{-4}$ mol/L or less.

(2-2-2) Reduction Potential

The reduction potential of each compound was measured with a solution of the compound in N,N-dimethylformamide having a concentration of $1\times10^{-6}$ mol/L or more and $1\times10^{-4}$ mol/L or less.

(2-2-3) Measurement Conditions

Measurement conditions for the CV method are shown below.
Measurement temperature: 25° C.
Reference electrode: Ag/AgNO₃
Counter electrode: platinum electrode
Working electrode: glassy carbon

(2-2-4) Results of Measurement and Evaluation

As a result of the measurement, the reduction potential of the host (H-1) was −2.19 V, and the reduction potential of the dopant (mixture in which D-2 and D-3 were mixed at 1:1) was −1.89 V.

As described in the foregoing, a difference between the reduction potentials corresponds to a difference in $|E_{LUMO}|$. Here, in this example, a value corresponding to "$|E_{LUMO}$(Dopant)|−|$E_{LUMO}$(Host)|$" is 0.30 eV.

The value means that the first requirement ($|E_{LUMO}$(Dopant)|−|$E_{LUMO}$(Host)|$>0.15$ eV) for the emitting layer to trap an electron is satisfied.

Meanwhile, as a result of the measurement, the oxidation potential of the host (H-1) was 0.98 V, and the oxidation potential of the dopant (mixture in which D-2 and D-3 were mixed at 1:1) was 1.18 V.

As described in the foregoing, a difference between the oxidation potentials corresponds to a difference in $|E_{HOMO}|$. Here, in this example, a value corresponding to "$|E_{HOMO}$(Dopant)|−|$E_{HOMO}$(Host)|$" is 0.20 eV.

The value means that the second requirement ($|E_{HOMO}$(Host)|<|$E_{HOMO}$(Dopant)|$) for the emitting layer to trap an electron is satisfied.

The foregoing results can lead to the conclusion that the emitting layer constituting the organic light emitting device of this example is an emitting layer trapping an electron. Therefore, an emission interface is the electron injection side of the emitting layer, i.e., an interface between the emitting layer and the hole blocking layer (and the vicinity thereof).

Comparative Example 1

An organic light emitting device was obtained by the same method as that of Example 1 except that in Example 1, the hole transport layer was formed only of the compound HT-2 (thickness: 45 nm). It should be noted that in this comparative example, the emitting layer is an emitting layer trapping an electron because the layer is formed of the same constituent materials as those of Example 1. Therefore, an emission interface is the electron injection side of the emitting layer, i.e., an interface between the emitting layer and the hole blocking layer.

The resultant organic light emitting device was observed to emit blue light when a voltage was applied while the ITO electrode was used as a positive electrode and the LiF/Al electrode was used as a negative electrode. An applied voltage at an emission luminance of 1,000 cd/m² was 4.7 V and an external quantum efficiency at a current density of 25 mA/cm² was 8.2%.

In addition, when the organic light emitting device of this comparative example was continuously driven by applying a voltage while maintaining a current density of 100 mA/cm², the LT75 was 69 hours, which meant that the lifetime of the device was shorter than that of Example 1 containing the hole-transportable dopant (HTD-4). This may be because the hole transport layer was free of a material strong against deterioration due to excitation (such as HTD-4).

Comparative Example 2

An organic light emitting device was obtained by the same method as that of Example 1 except that in Example 1, DPA shown below was used as the hole-transportable dopant instead of HTD-4.

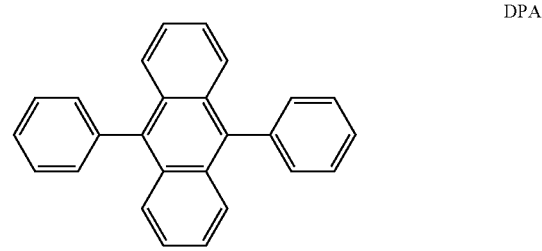 [SMILES: c1ccc(-c2c3ccccc3c(-c3ccccc3)c3ccccc23)cc1]

DPA

It should be noted that in this comparative example, the emitting layer is an emitting layer trapping an electron because the layer is formed of the same constituent materials as those of Example 1. Therefore, an emission interface is the electron injection side of the emitting layer, i.e., an interface between the emitting layer and the hole blocking layer.

The resultant device was observed to emit blue light when a voltage was applied while the ITO electrode was used as a positive electrode and the LiF/Al electrode was used as a negative electrode. An applied voltage at an emission luminance of 1,000 cd/m² was 4.9 V and an external quantum efficiency at a current density of 25 mA/cm² was 7.8%.

In addition, when the device of this comparative example was continuously driven by applying a voltage while maintaining a current density of 100 mA/cm², the time period (LT75) required for the luminance to reduce to 75% of the initial value was 68 hours, which showed that the doping with DPA provided no effect on the lengthening of the lifetime of the device.

This may be because DPA used as the hole-transportable dopant is a material weak against deterioration due to excitation, and hence DPA causes deterioration due to excitation in the hole transport layer together with HT-2. That is, it may be because a free radical produced by the deterioration of DPA due to excitation has high reactivity and hence causes the deterioration of the hole transport layer.

Here, the reason why DPA is a compound weak against deterioration due to excitation is that DPA is a compound containing none of the partial structures represented by the general formulae (ii-1) and (ii-2).

The foregoing results showed that the lengthening of the lifetime of the organic light emitting device was able to be achieved by satisfying the following requirements. When the emitting layer is caused to trap an electron, the emission interface is located away from the hole transport layer containing the arylamine compound. In addition, the hole transport layer having the arylamine compound is doped with the aromatic hydrocarbon having any one of the partial structures represented by the general formulae (ii-1) and (ii-2).

The technology of the present invention is applicable not only to a display apparatus such as a full-color display but also to, for example, lighting equipment, equipment using a photoelectric conversion device, or electrophotographic equipment.

According to the present invention, the organic light emitting device that has high efficiency and high durability against continuous driving can be provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-086189, filed Apr. 5, 2012, which is hereby incorporated by reference herein in its entirety.

What is claimed is:

1. An organic light emitting device comprising:
an anode;
a cathode; and
organic compound layers placed between the anode and the cathode,
wherein the organic compound layers include at least a hole transport layer and an emitting layer, the hole transport layer and the emitting layer being in contact with each other;
wherein the hole transport layer has an arylamine compound and an aromatic hydrocarbon compound;

wherein the aromatic hydrocarbon compound may have an alkyl group and the aromatic hydrocarbon compound satisfies the following requirements (i) and (ii):
(i) the compound comprises a compound constituted only of carbon atom and hydrogen atom, and
(ii) the compound has a partial structure represented by one of the following general formulae (ii-1) and (ii-2):

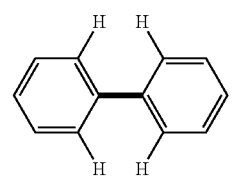

(ii-1)

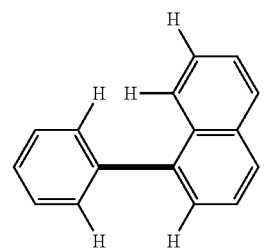

(ii-2)

wherein the emitting layer has a host and an electron trap dopant; and
wherein the host and the electron trap dopant satisfy the following expressions (A) and (B):

$$|E_{LUMO}(\text{Dopant})| - |E_{LUMO}(\text{Host})| > 0.15 \text{ eV} \quad (A)$$

$$|E_{HOMO}(\text{Host})| < |E_{HOMO}(\text{Dopant})| \quad (B)$$

where, in the expressions (A) and (B), $E_{LUMO}(\text{Dopant})$ represents a LUMO energy of the electron trap dopant, $E_{LUMO}(\text{Host})$ represents a LUMO energy of the host, $E_{HOMO}(\text{Host})$ represents a HOMO energy of the host, and $E_{HOMO}(\text{Dopant})$ represents a HOMO energy of the electron trap dopant.

2. The organic light emitting device according to claim 1, wherein the organic compound layers further include an electron transport layer placed between the emitting layer and the cathode, and the electron transport layer is in contact with the emitting layer.

3. The organic light emitting device according to claim 1, wherein the aromatic hydrocarbon compound comprises a hydrocarbon compound having a pyrene skeleton as a partial structure.

4. The organic light emitting device according to claim 1, wherein the electron trap dopant comprises an organic compound having a fluoranthene skeleton.

5. A display apparatus, comprising multiple pixels, wherein the multiple pixels each include the organic light emitting device according to claim 1 and a transistor connected to the organic light emitting device.

6. An image display apparatus comprising:
a display unit for displaying an image; and
an image input unit for inputting image information,
wherein the display unit includes multiple pixels; and
wherein the multiple pixels each include the organic light emitting device according to claim 1 and a transistor connected to the organic light emitting device.

7. A lighting apparatus comprising:
the organic light emitting device according to claim 1; and
a converter circuit for supplying electric power to the organic light emitting device.

8. A device comprising a substrate and the organic light emitting device according to claim 1.

* * * * *